United States Patent
Miyazaki

(10) Patent No.: US 10,032,486 B2
(45) Date of Patent: Jul. 24, 2018

(54) SEMICONDUCTOR MEMORY DEVICE

(71) Applicant: TOSHIBA MEMORY CORPORATION, Minato-ku, Tokyo (JP)

(72) Inventor: Takayuki Miyazaki, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/455,608

(22) Filed: Mar. 10, 2017

(65) Prior Publication Data

US 2018/0151200 A1    May 31, 2018

Related U.S. Application Data

(60) Provisional application No. 62/426,702, filed on Nov. 28, 2016.

(51) Int. Cl.
| | |
|---|---|
| G11C 5/06 | (2006.01) |
| H01L 45/00 | (2006.01) |
| H01L 27/24 | (2006.01) |
| H01L 23/528 | (2006.01) |
| G11C 13/00 | (2006.01) |

(52) U.S. Cl.
CPC .......... G11C 5/063 (2013.01); G11C 13/004 (2013.01); G11C 13/0069 (2013.01); G11C 13/0097 (2013.01); H01L 23/5283 (2013.01); H01L 27/2454 (2013.01); H01L 27/2481 (2013.01); H01L 45/1233 (2013.01)

(58) Field of Classification Search
CPC ..... G11C 7/18; G11C 13/025; G11C 16/0416; G11C 16/0483; G11C 2213/17; G11C 2213/75; G11C 7/06; G11C 16/28; G11C 17/16; G11C 17/18; G11C 2207/002; G11C 5/063; G11C 7/14
USPC ..... 365/230.03, 102, 189.05, 194, 203, 207, 365/103, 104, 148, 163, 185.11, 185.13, 365/185.18, 185.21

See application file for complete search history.

(56) References Cited

U.S. PATENT DOCUMENTS

| | | |
|---|---|---|
| 8,139,394 B2 | 3/2012 | Maejima et al. |
| 8,873,285 B2 | 10/2014 | Sharon et al. |
| 9,299,427 B2 | 3/2016 | Chevallier et al. |
| 9,343,115 B2 | 5/2016 | Ueda et al. |
| 9,356,074 B1 | 5/2016 | Shimabukuro et al. |
| 9,390,793 B1 * | 7/2016 | Nigam ................ G11C 13/004 |
| 2010/0246302 A1 | 9/2010 | Seko |
| 2014/0050010 A1 | 2/2014 | Toda |
| 2014/0254242 A1 | 9/2014 | Siau |
| 2015/0179250 A1 | 6/2015 | Chevallier et al. |

* cited by examiner

*Primary Examiner* — Thong Q Le
(74) *Attorney, Agent, or Firm* — Foley & Lardner LLP

(57) ABSTRACT

According to one embodiment, a semiconductor memory device includes: a first insulating layer; a global bit line and a reference bit line provided on the first insulating layer; a second insulating layer provided on the global bit line and the reference bit line; a select gate line provided on the second insulating layer; a first transistor provided on the global bit line; a local bit line coupled to the first transistor; first and second memory cells; and a sense amplifier. The global bit line and the reference bit line three-dimensionally intersect the select gate line via the second insulating layer.

11 Claims, 28 Drawing Sheets

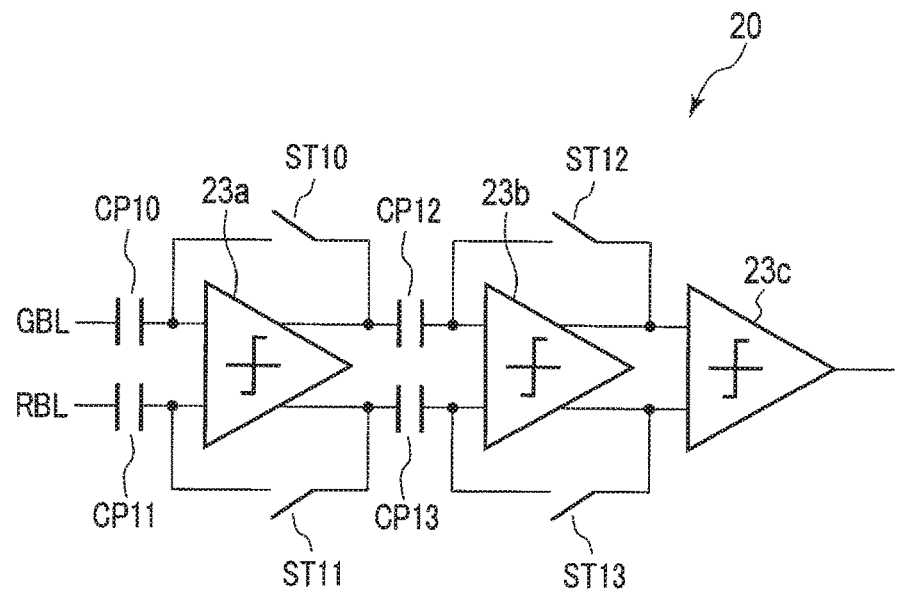
F I G. 8
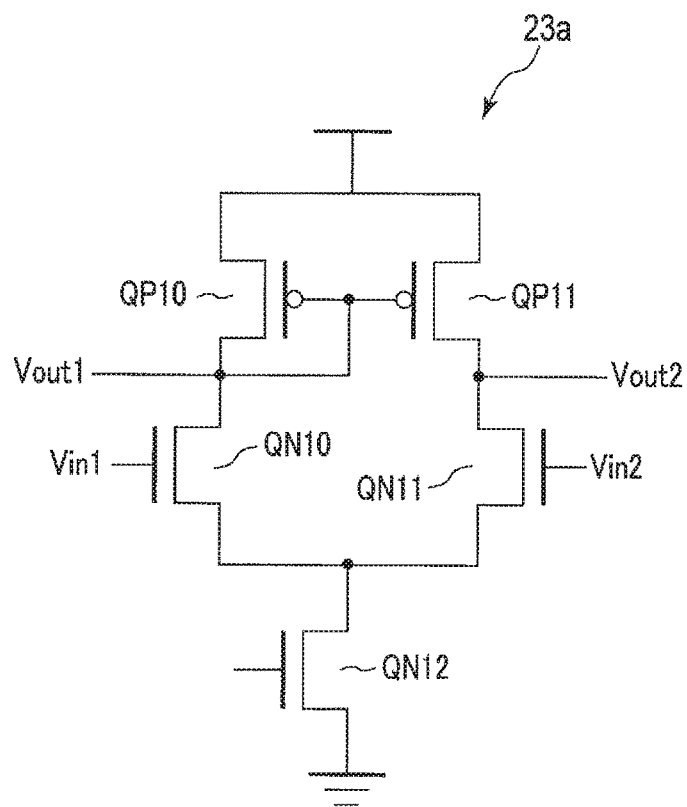
F I G. 9

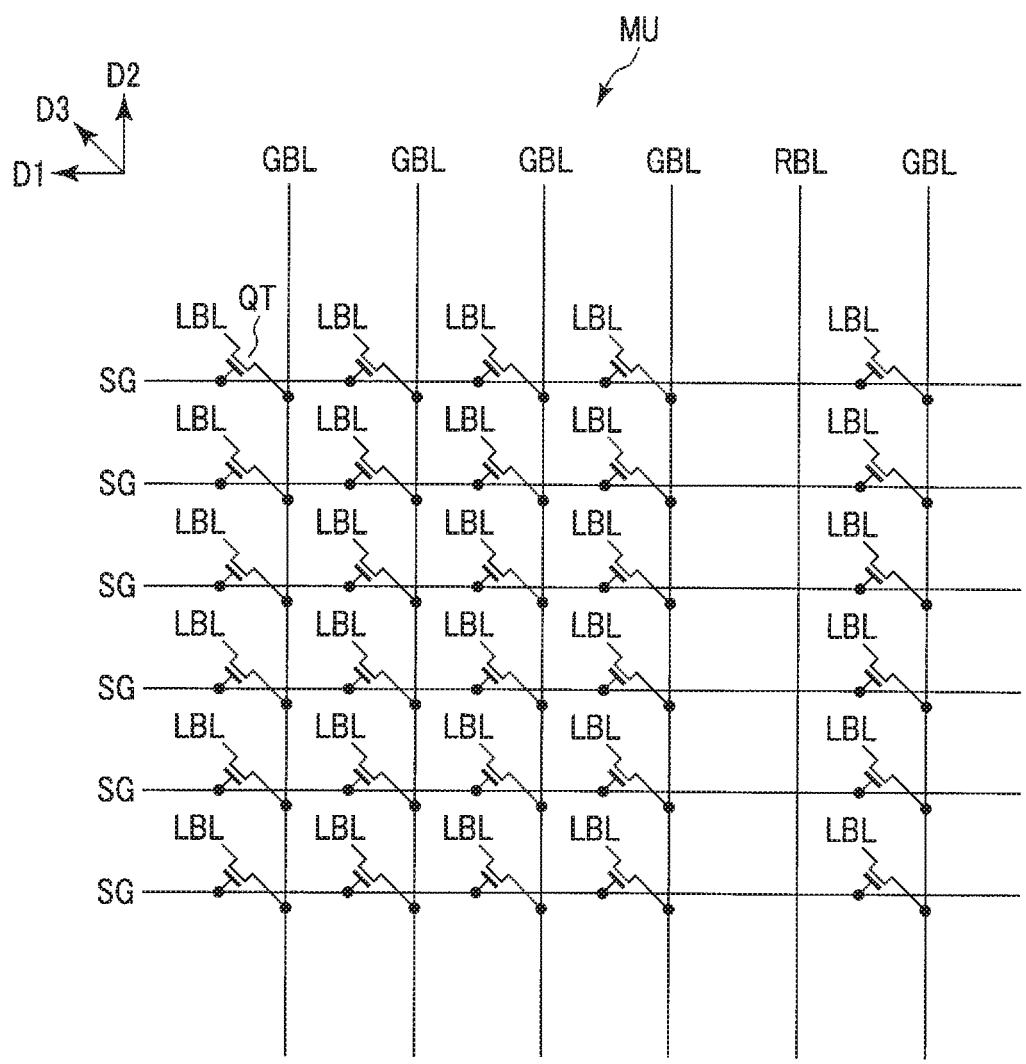
F I G. 16

×; Disconnect

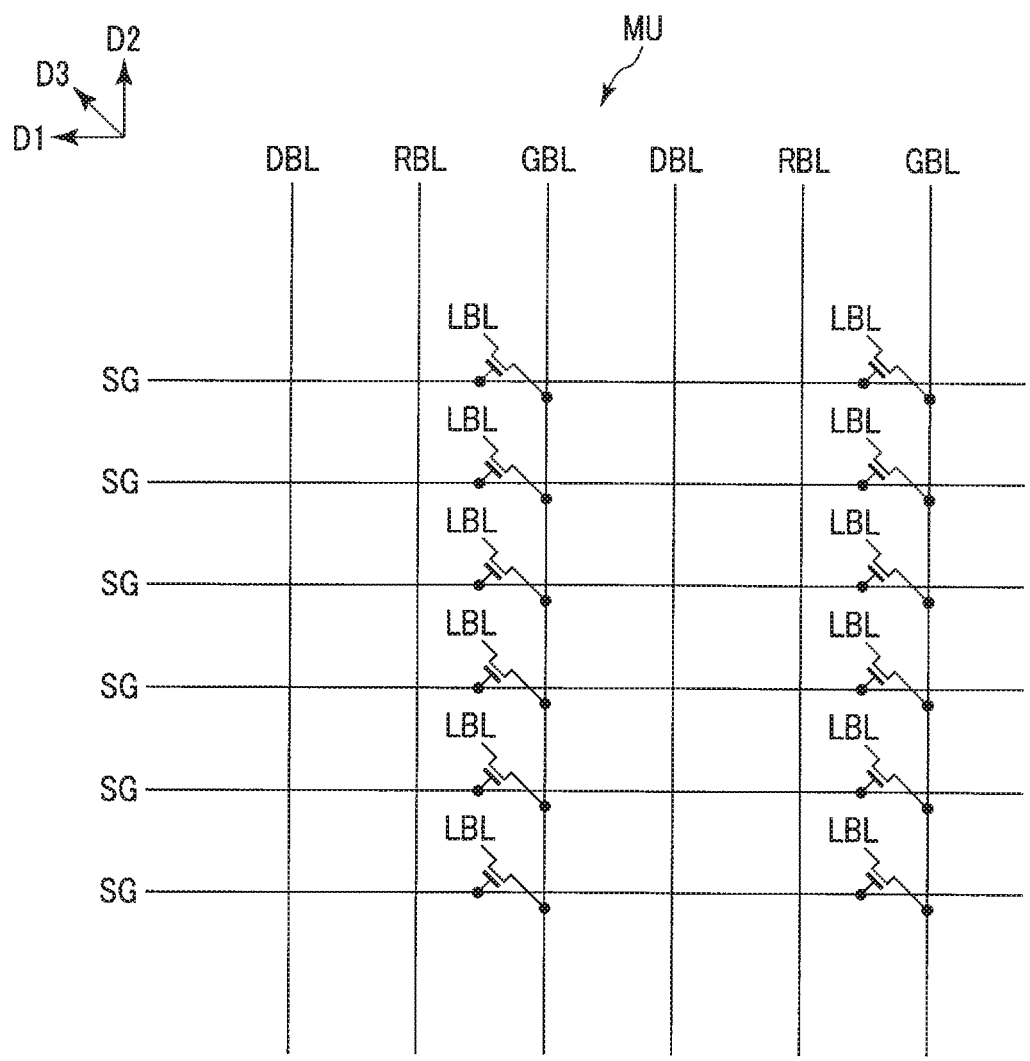
F I G. 25

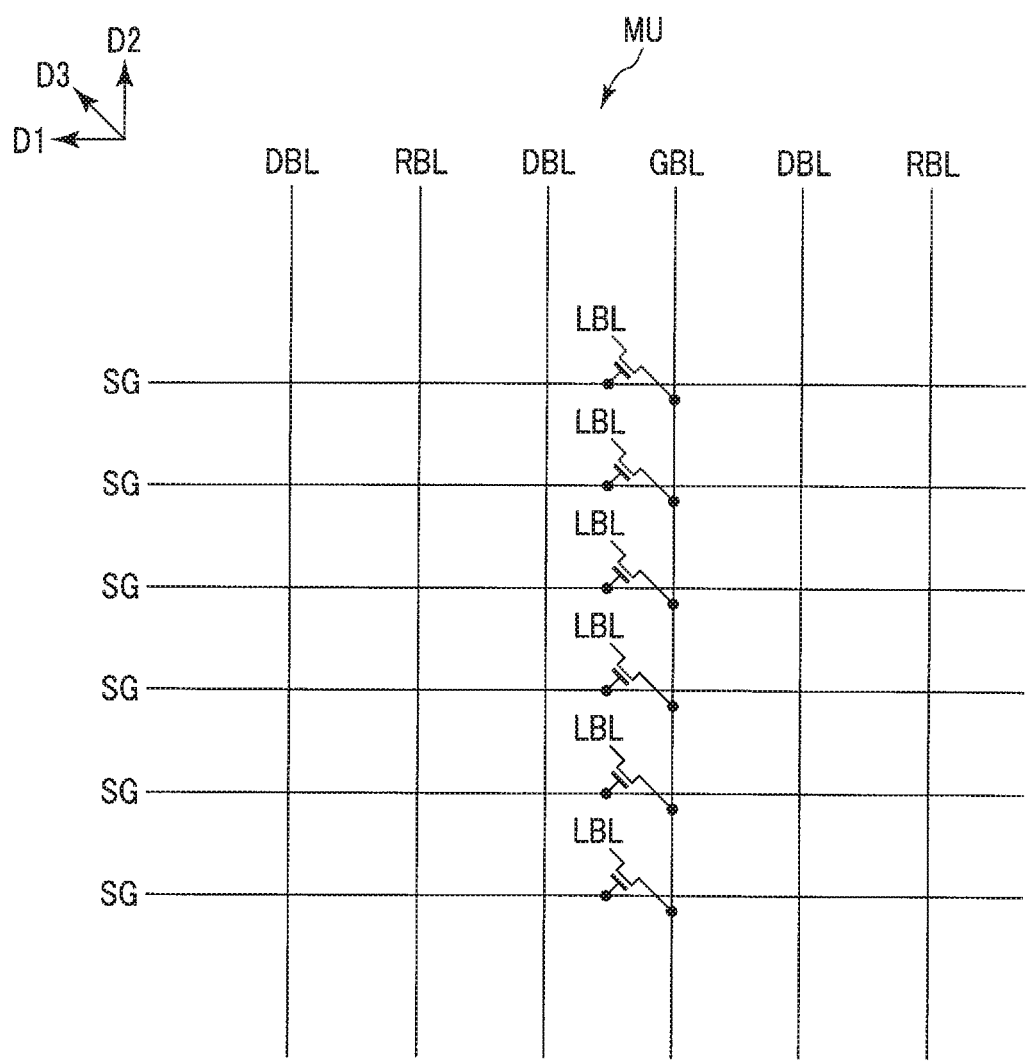
F I G. 26

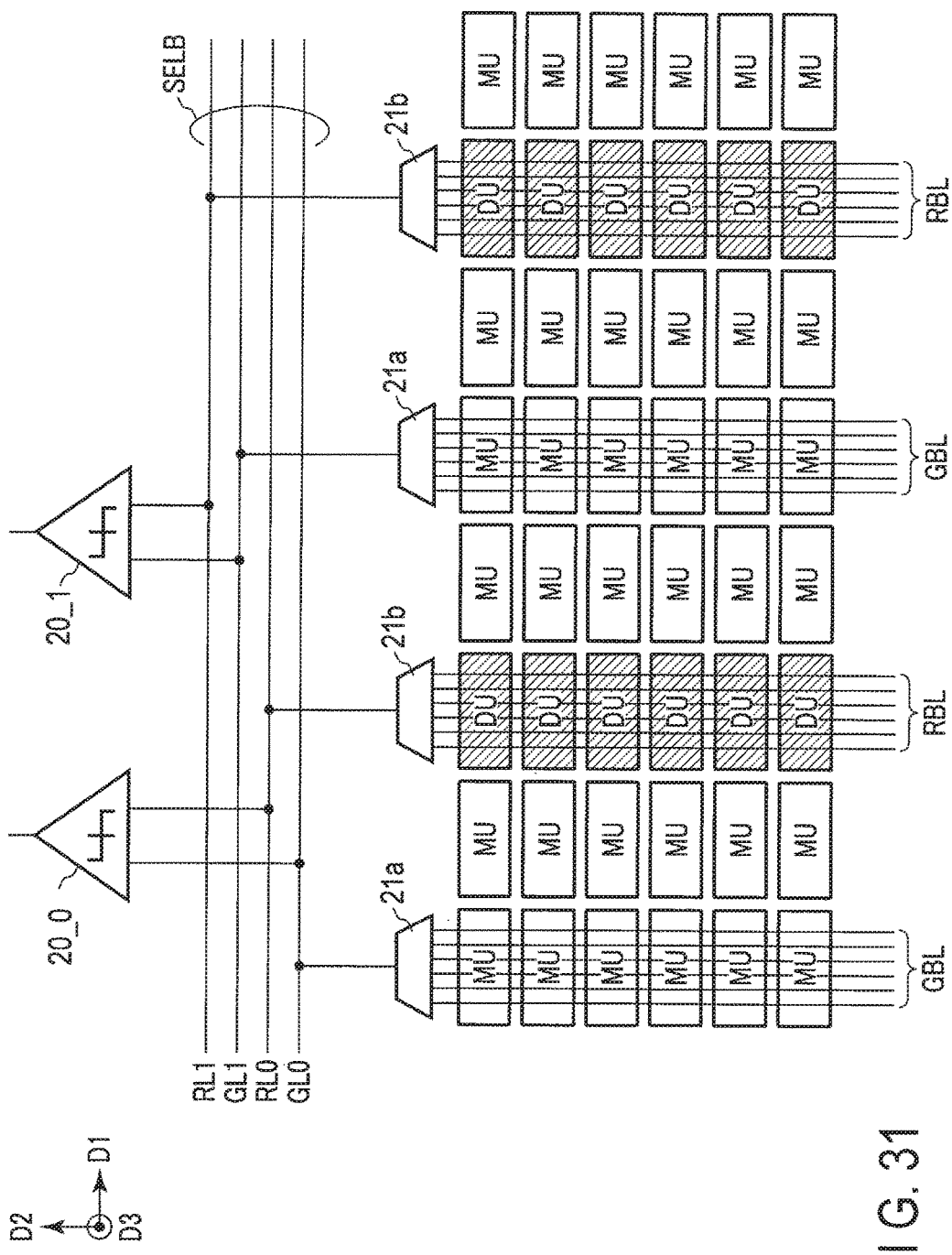
F I G. 31

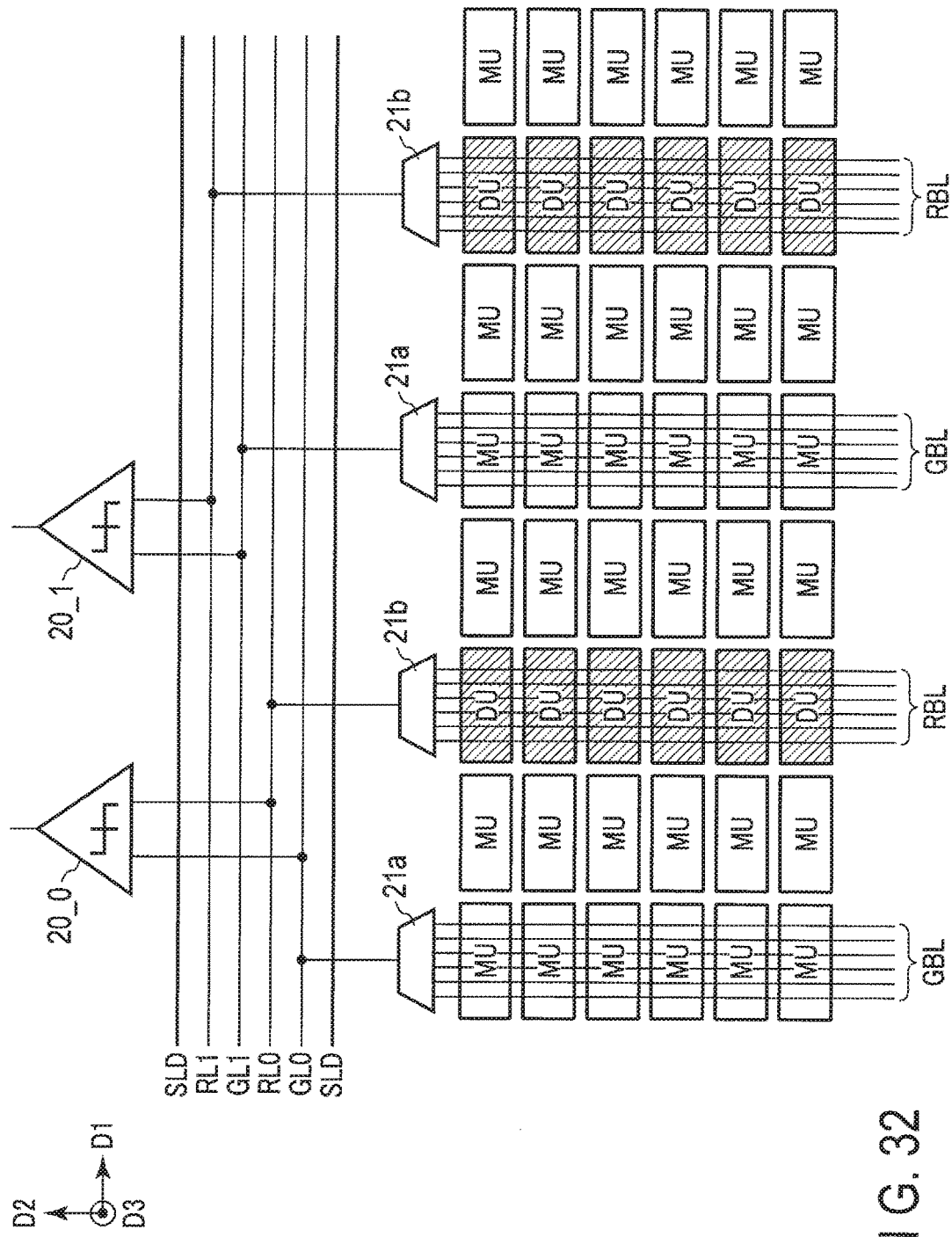
F I G. 32

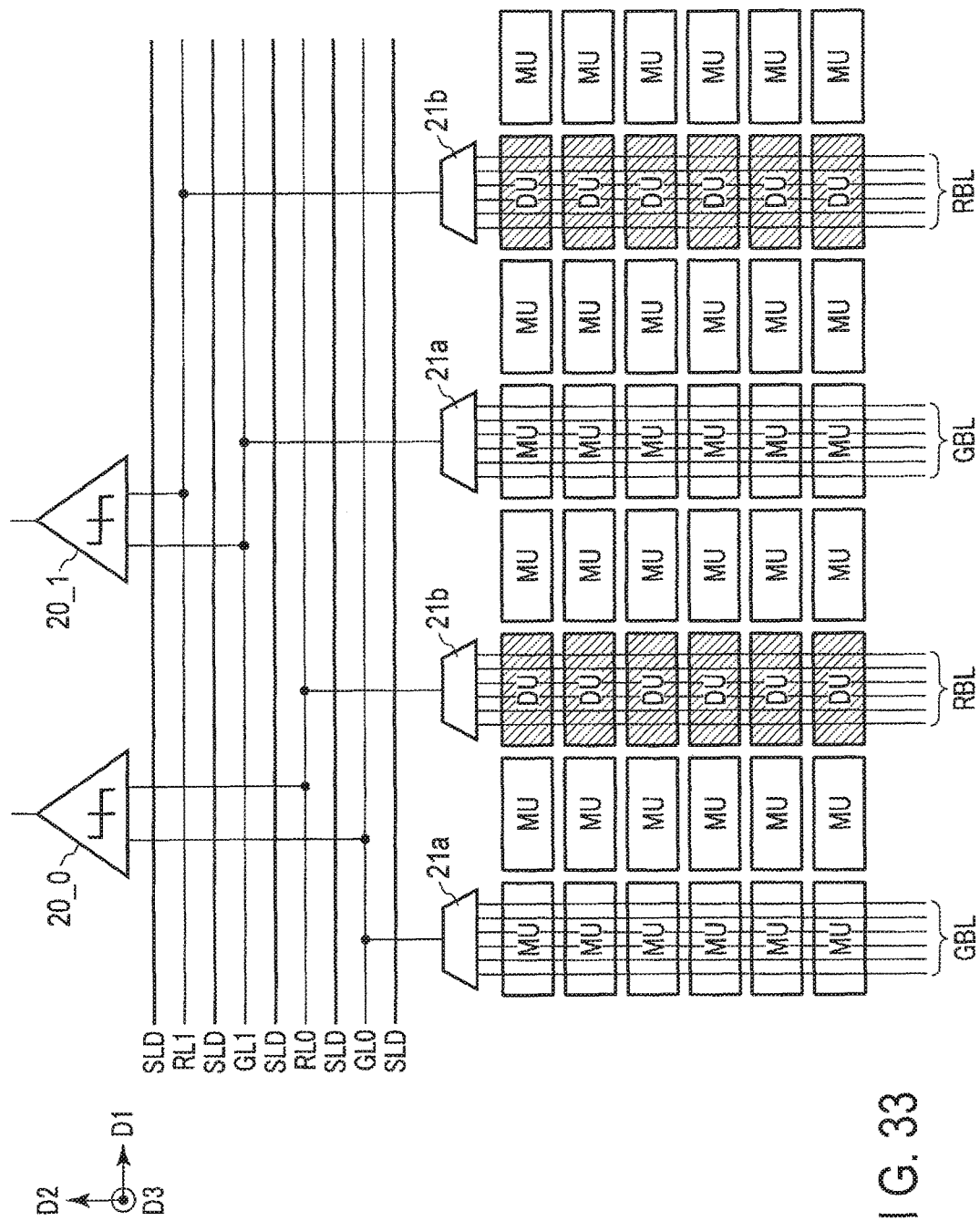
F I G. 33

SEMICONDUCTOR MEMORY DEVICE

CROSS-REFERENCE TO RELATED APPLICATIONS

This application claims the benefit of U.S. Provisional Application No. 62/426,702, filed Nov. 28, 2016, the entire contents of which are incorporated herein by reference.

FIELD

Embodiments described herein relate generally to a semiconductor memory device.

BACKGROUND

One type of semiconductor memory device is known to have resistive random access memory. Resistive random access memory stores data by setting a resistance value of a memory element for a low resistance state or for a high resistance state.

BRIEF DESCRIPTION OF THE DRAWINGS

FIG. 8 is a block diagram of a sense circuit provided in the semiconductor memory device according to the first embodiment;

FIG. 9 is a block diagram of a differential amplifier 23a provided in the semiconductor memory device according to the first embodiment;

FIG. 16 is a schematic diagram depicting a layout of the global bit lines and the reference bit line in the memory cell array provided in the semiconductor memory device according to a second example of the third embodiment;

FIG. 25 is a schematic diagram depicting a layout of the global bit lines and the reference bit line in the memory cell array provided in the semiconductor memory device according to an eleventh example of the third embodiment;

FIG. 26 is a schematic diagram depicting a layout of the global bit lines and the reference bit line in the memory cell array provided in the semiconductor memory device according to a twelfth example of the third embodiment;

FIG. 31 is a schematic diagram depicting a layout of a selected bit line group provided in the semiconductor memory device according to a first example of a fifth embodiment;

FIG. 32 is a schematic diagram depicting a layout of the selected bit line group provided in the semiconductor memory device according to a second example of the fifth embodiment;

FIG. 33 is a schematic diagram depicting a layout of the selected bit line group provided in the semiconductor memory device according to a third example of the fifth embodiment;

DETAILED DESCRIPTION

In general, according to one embodiment, a semiconductor memory device includes: a first insulating layer provided above a semiconductor substrate; a global bit line provided on the first insulating layer and extending in a first direction parallel to the semiconductor substrate; a reference bit line provided on the first insulating layer and extending in the first direction; a second insulating layer provided on the global bit line and the reference bit line; a select gate line provided on the second insulating layer and extending in a second direction parallel to the semiconductor substrate and different from the first direction; a first transistor provided on the global bit line, a first end of the first transistor being coupled to the global bit line, a gate of the first transistor being coupled to the select gate line; a local bit line coupled to a second end of the first transistor and extending in a third direction perpendicular to the semiconductor substrate; first and second memory cells stacked above the semiconductor substrate and coupled to the local bit line; and a sense amplifier including a first input terminal coupled to the global bit line and a second input terminal coupled to the reference bit line, the sense amplifier being capable of reading data from the first and second memory cells. The global bit line and the reference bit line three-dimensionally intersect the select gate line via the second insulating layer.

1. First Embodiment

A semiconductor memory device according to a first embodiment will be described. In the first embodiment, a three-dimensional stacked ReRAM (resistance random access memory) will be described by way of example. In the following description, terms "connect" and "couple" include not only direct connections but also physical or electric connections via any elements. Furthermore, a first end of a transistor represents one of a source or a drain of the transistor, and a second end of the transistor represents the other of the source or the drain.

1.1 General Configuration of the Semiconductor Memory Device

First, a general configuration of a semiconductor memory device according to the present embodiment will be described.

Figure 1:
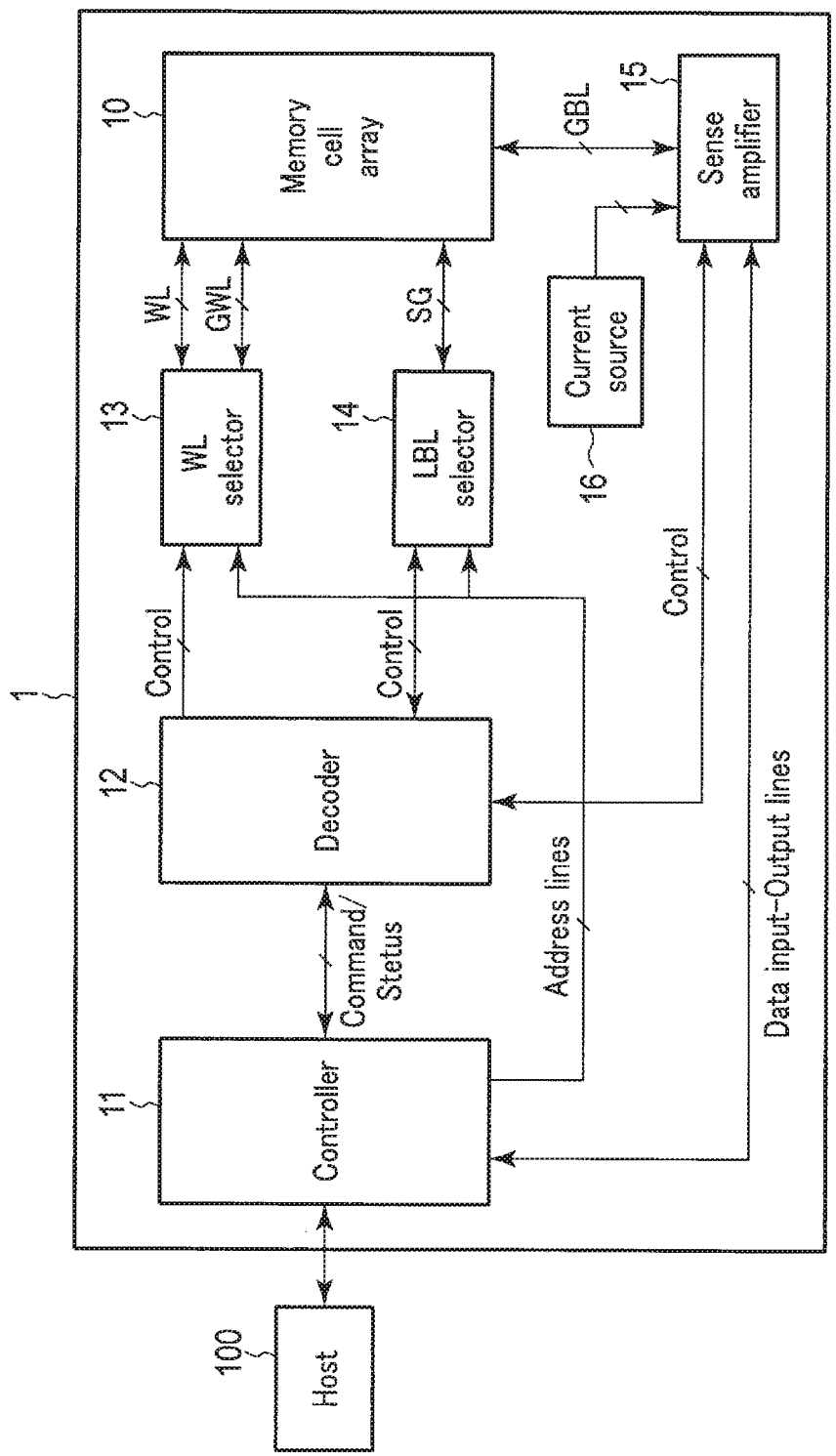
FIG. 1 is a block diagram of a semiconductor memory device according to a first embodiment.

FIG. 1 is a block diagram of the semiconductor memory device according to the first embodiment.

As depicted in FIG. 1, an ReRAM 1 includes a memory cell array 10, a controller 11, a decoder 12, a WL selector 13, an LBL selector 14, a sense amplifier 15, and a current source 16. In an example in FIG. 1, some of signal lines connecting blocks together are omitted for simplification of description.

The memory cell array 10 includes a plurality of memory cells, that is, resistive random access memory elements, to store data in a nonvolatile manner. A resistance value of a memory cell is varied by applying a needed voltage to the memory cell. For example, a state where the memory cell is in a low resistance state is referred to as a "set state". A state where the memory cell is in a high resistance state is referred to as a "reset state". Data is stored such that, for example, the set state is stored as "1" data, while the reset state is stored as "0" data. The memory cell will be described below in detail.

The controller 11 transmits and receives various signals (data, command signals, address signals, and the like) to and from host equipment 2. The controller 11 controls the whole ReRAM 1 in accordance with input signals, for example, writes or reads data. More specifically, the controller 11 transmits command signals to the decoder 12 and receives status signals from the decoder 12. The status signal contains, for example, status information for the memory cell array 10 based on a write result and a read result. The controller 11 transmits address signals to the WL selector 13 and the LBL selector 14 via address lines. The controller 11 also transmits and receives data to and from the sense amplifier 15 via data input-output lines.

The decoder 12 decodes, for example, command signals, and based on a decode result, transmits control signals to the WL selector 13, the LBL selector 14, and the sense amplifier 15. Furthermore, the decoder 12 transmits status signals to the controller 11. The decoder 12 is connected to each of the WL selector 13, the LBL selector 14, and the sense amplifier 15 via a plurality of control lines.

The WL selector 13 selects from word lines WL and from global word lines GWL in accordance with control signals received from the decoder 12 and address signals received from the controller 11. Then, the WL selector 13 applies appropriate voltages to the selected word line WL and the selected global word line GWL. The WL selector 13 is connected to the memory cell array 10 via a plurality of word lines WL and a plurality of global word lines GWL. The WL selector 13 may select a plurality of word lines WL and a plurality of global word lines GWL.

The LBL selector 14 selects from local bit lines LBL connected to the memory cell array 10 in accordance with control signals received from the decoder 12 and address signals received from the controller 11. More specifically, the LBL selector 14 applies an appropriate voltage to select gate lines SG corresponding to the selected local bit lines LBL. The LBL selector 14 is connected to the memory cell array 10 via a plurality of select gate lines SG. The voltage applied to the select gate line SG may be one of three or more voltages instead of one of two voltages corresponding to selection and non-selection of the corresponding local bit line LBL.

The sense amplifier 15 writes write data received from the controller 11 to selected memory cells. Furthermore, the sense amplifier 15 transmits data read from the selected memory cells to the controller 11. The sense amplifier 15 transmits and receives data to and from the memory cell array 10 via a plurality of global bit lines GBL. Moreover, the sense amplifier 15 is connected to the current source 16. A layout of the global bit lines GBL will be described below.

The current source 16 supplies the sense amplifier 15 with, for example, a current needed to write or read data. For example, the current source 16 supplies a reference current Iref for data read. The reference current Iref has, for example, a current value that is intermediate between a value of a current flowing when the memory cell is in the high resistance state and a value of a current flowing when the memory cell is in the low resistance state. A current flowing through the memory cell is hereinafter referred to as a cell current Icell.

1.2 Configuration of the Memory Cell Array and the Sense Amplifier

Now, a configuration of the memory cell array 10 and the sense amplifier 15 will be described.

Figure 2:
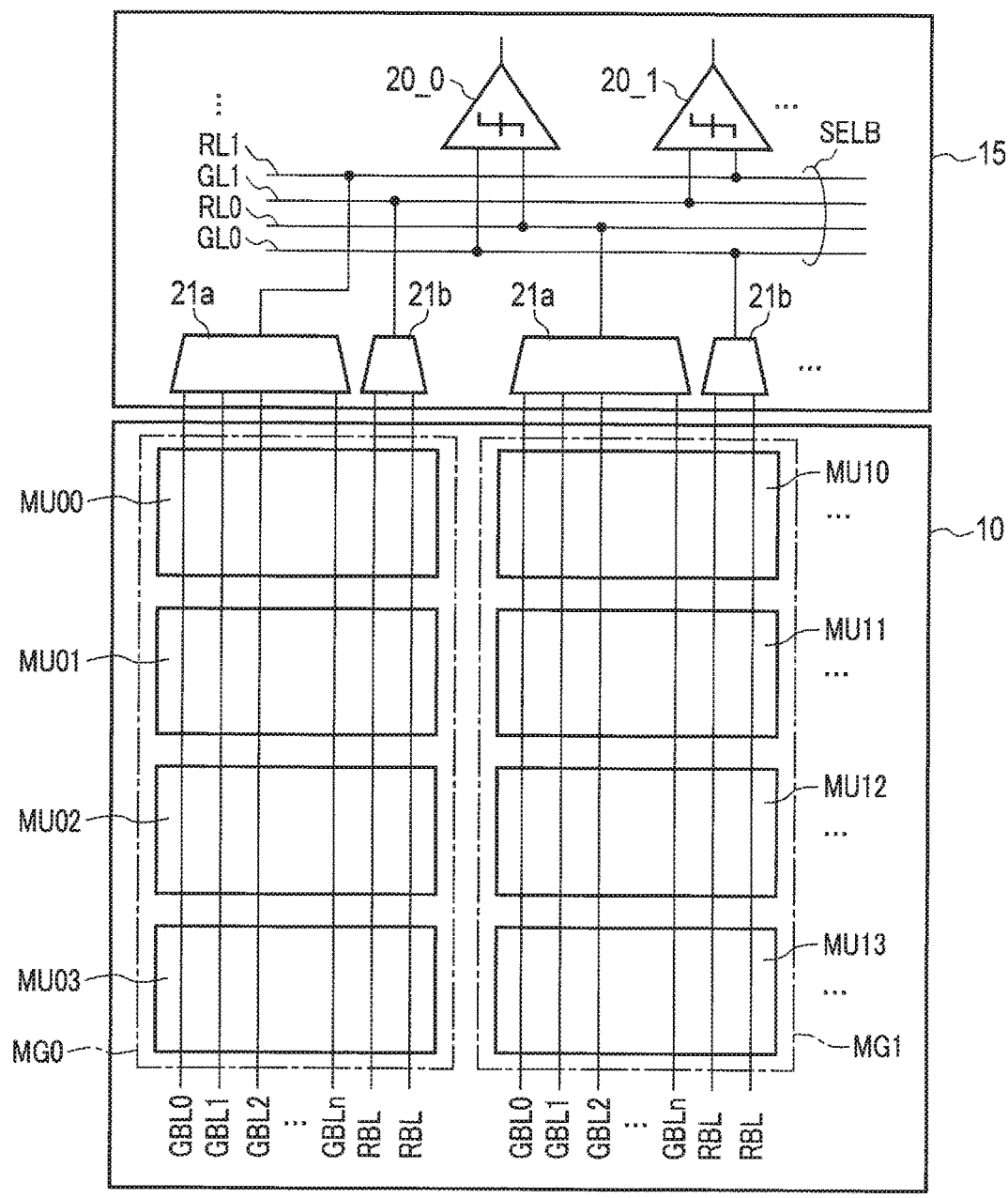
FIG. 2 is a block diagram of a memory cell array and a sense amplifier provided in the semiconductor memory device according to the first embodiment.

FIG. 2 is a block diagram of the memory cell array 10 and the sense amplifier 15 provided in the semiconductor memory device according to the first embodiment.

The memory cell array 10 includes a plurality of memory groups MG (MG0, MG1, . . . ). The memory group MG includes a plurality of memory units MU (MU0, MU1, . . . ) to all of which each of the global bit lines GBL is commonly connected. The memory groups MG are independent of one another and can perform write and read operations at the same time or at different timings. The number of the memory groups MG can be optionally set.

An example in FIG. 2 illustrates a case where one memory group MG includes four memory units MU. More specifically, for example, the memory group MG0 includes four memory units MU00, MU01, MU02, and MU03. Furthermore, for example, the memory group MG1 includes four memory units MU10, MU11, MU12, and MU13. The number of the memory units MU can be optionally set. Each of the memory units MU is a set of memory cells connected together by one or more word lines WL. For example, the controller 11 selects one memory unit MU from each memory group MG for write and read operations.

The sense amplifier 15 includes a plurality of sense circuits 20 (20_0, 20_1, . . . ) and multiplexers 21a and 21b provided in association with the sense circuits 20.

Each of the sense circuits 20 writes and reads data to and from a selected memory cell. More specifically, in a read operation, each sense circuit 20 compares the cell current Icell flowing through the selected memory cell, via a global line GL and a selected global bit line GBL, and the reference current Iref flowing through a reference line RL and a selected reference bit line RBL to read data stored in the selected memory cell. For example, when the cell current Icell flowing through the selected memory cell is larger than the reference current Iref, the sense circuit 20 determines that the selected memory cell is in the low resistance state (for example, the selected memory cell holds "1" data). When the cell current Icell flowing through the selected memory cell is smaller than the reference current Iref, the sense circuit 20 determines that the selected memory cell is in the high resistance state (for example, the selected memory cell holds "0" data).

Furthermore, each sense circuit 20 writes data by applying a needed voltage to the selected memory cell connected to the selected global bit line GBL.

For example, the sense circuits 20 are provided in association with the number of memory cells on which read or write is executed at a time. A first input terminal of the sense circuit 20 is connected to the selected global bit line GBL via the global line GL and the multiplexer 21a. A second input terminal of the sense circuit 20 is connected to the selected reference bit line RBL via the reference line RL and the multiplexer 21b. For example, the first input terminal of the sense circuit 20_0 is connected to the global line GL0. The second input terminal of the sense circuit 20_0 is connected to the reference line RL0. Groups of the global lines GL (GL0, GL1, . . . ) and the reference lines RL (RL0, RL1, . . . ) are referred to as selected bit line groups SELB.

The multiplexer 21a selects the global bit line GBL needed for write and read, from the plurality of global bit lines GBL (GBL0, GBL1, GBL2, . . . , GBLn (n is an integer of 1 or more) to connect the selected global bit line GBL to the corresponding global line GL. The number of global bit lines GBL selected by the multiplexer 21a may be two or more. Furthermore, the multiplexer 21a may have a function to enable a voltage to be transferred to unselected global bit lines GBL.

The multiplexer 21b selects the reference bit line RBL needed for write and read, from the plurality of reference bit lines RBL provided in association with the memory group MG to connect the selected reference bit line RBL to the corresponding reference line RL. The number of reference bit lines RBL may be the same as or different from the number of global bit lines GBL. The number of reference bit lines RBL selected by the multiplexer 21b may be two or more. Moreover, the number of reference bit lines RBL selected by the multiplexer 21b may be one. In this case, the multiplexer 21b is omitted. Furthermore, the multiplexer 21b may have a function to enable a voltage to be transferred to unselected reference bit line RBL.

The sense circuits 20 may be provided in association with the global bit lines GBL and the reference bit lines RBL. In this case, the multiplexers 21a and 21b are omitted. More specifically, for example, the sense circuits 20_0 to 20_n and the reference bit lines RBL0 to RBLn are provided in association with the global bit lines GBL0 to GBLn in the memory group MG0. The global bit line GBL0 and the reference bit line RBL0 are connected to the two input terminals of the sense circuit 20_0. This also applied to the other sense circuits 20_1 to 20_n.

1.3 Configuration of the Memory Unit

Now, a configuration of the memory unit MU will be described.

Figure 3:
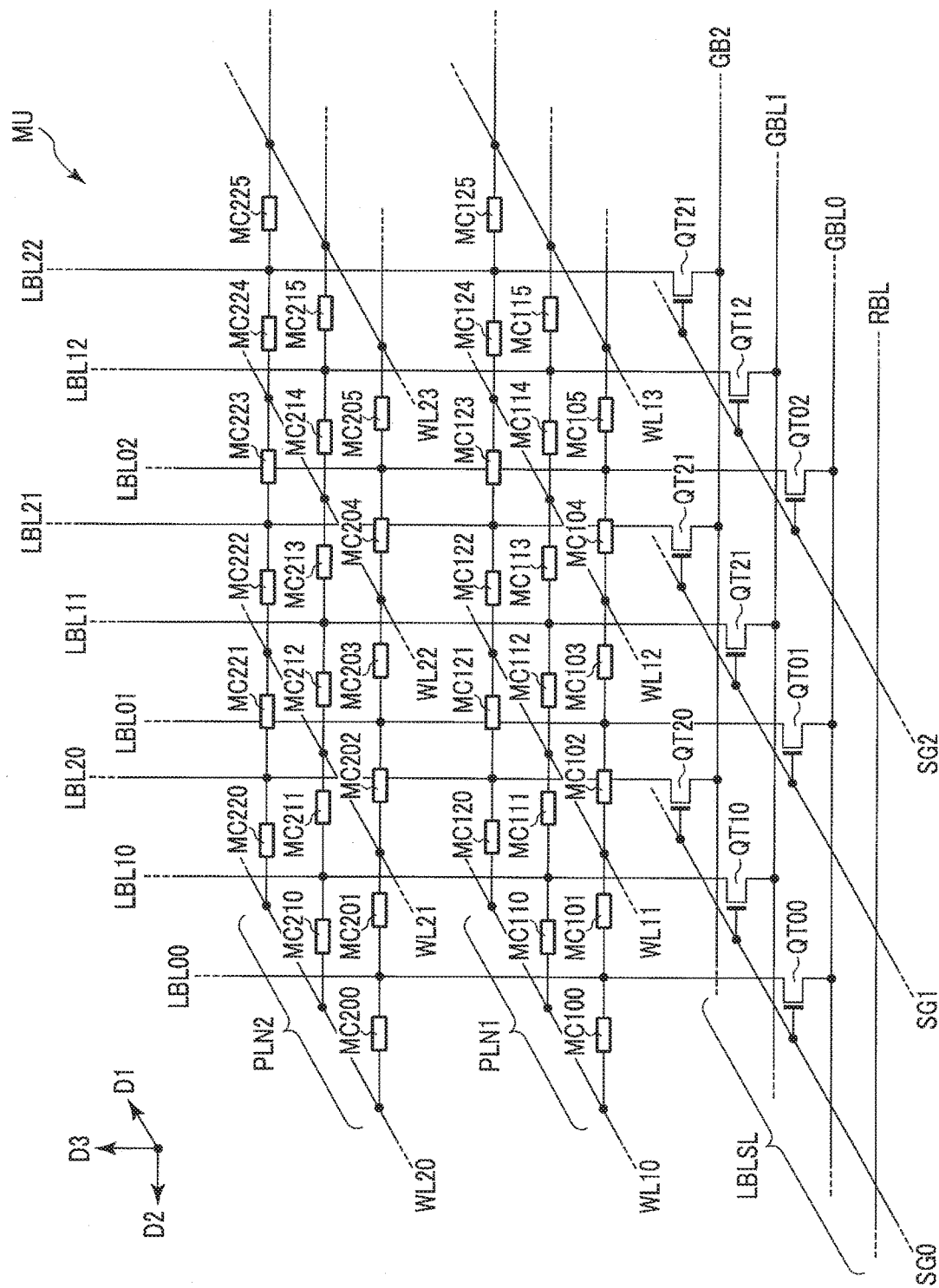
FIG. 3 is a perspective view depicting a layout of a memory unit provided in the semiconductor memory device according to the first embodiment.

FIG. 3 is a perspective view illustrating a layout of the memory unit MU provided in the semiconductor memory device according to the first embodiment.

As depicted in FIG. 3, memory cells MC are three-dimensionally arranged on a semiconductor substrate. Roughly speaking, the ReRAM 1 includes three layers, an LBL select layer LBLSL and planes PLN1 and PLN2 arranged in this order from the bottom. The number of the planes PLN may be optionally set.

The following are arranged in the LBL select layer LBLSL: a plurality of vertical thin film transistors QT (QT00 to QT02, QT10 to QT12, QT20 to QT22, . . . ) connecting the global bit lines GBL (GBL0, GBL1, GBL2, . . . ) and the local bit lines LBL (LBL00 to LBL02, LBL10 to LBL12, LBL20 to LBL22, . . . ) together. To a first end of each of the transistors QT, the corresponding global bit line GBL is connected. To a second end of the transistor QT, the corresponding local bit line LBL is connected. To a gate of the transistor QT, the corresponding select gate line SG is connected.

More specifically, a plurality of the global bit lines GBL and the reference bit line RBL are arranged which extend in a second direction D2 parallel to the semiconductor substrate. Above the global bit lines GBL and the reference bit line RBL, a plurality of the select gate lines SG (SG0, SG1, SG2, . . . ) is arranged which extends in a first direction D1 parallel to the semiconductor substrate and perpendicular to the second direction D2. The select gate lines SG are arranged so as to three-dimensionally intersect the global bit lines GBL and the reference bit line RBL via insulating layers not depicted in the drawings.

The transistors QT are arranged on the global bit lines GBL in a matrix along the first direction D1 and the second direction D2. A first end of a set of a plurality of the transistors QT arranged along the second direction D2 is connected to one of the global bit lines GBL. A gate of a set of a plurality of the transistors QT arranged along the first direction D1 is connected to one of the select gate lines SG. A second end of each transistor QT is connected to one of the local bit lines LBL extending in a third direction D3 perpendicular to the semiconductor substrate. Each of the local bit lines LBL is connected to both two memory cells MC in each of the planes PLN.

In the example in FIG. 3, no transistor QT is arranged on the reference bit line RBL. However, the present embodiment is not limited to this. For example, the transistor QT may be provided on the reference bit line RBL, with a first end of the transistor QT connected to the reference bit line RBL. In this case, no local bit line LBL is connected to (no local bit line LBL is provided at) the second end of the transistor QT connected to the reference bit line RBL, or no local bit line LBL or memory cell MC is connected to (no memory cell MC is provided at) the second end of the transistor QT connected to the reference bit line RBL.

The transistor connected to the global bit line GBL0 and the select gate line SG0 is denoted by QT00. The local bit line connected to the transistor QT00 is denoted by LBL00. Similarly, the transistor connected to the global bit line GBL1 and the select gate line SG2 is denoted by QT12. The local bit line connected to the transistor QT12 is denoted by LBL12. This applies to the other transistors QT (QT10, QT20, QT01, QT11, QT21, QT02, and QT22) and the other local bit lines LBL (LBL10, LBL20, LBL01, LBL11, LBL21, LBL02, and LBL22).

The first end of each of the memory cells MC in the planes PLN1 and PLN2 is connected to one of the local bit lines LBL. The second end of the memory cell MC is connected to one of the word lines WL arranged along the first direction D1.

The word lines arranged in the plane PLN1 are denoted by WL10, WL11, WL12, WL13, . . . , and the word lines arranged in the plane PLN2 are denoted by WL20, WL21, WL22, WL23, . . . , respectively. In the plane PLN1, the memory cells connected to the word line WL10 and each of the local bit lines LBL00, LBL10, and LBL20 are denoted by MC100, MC110, and MC120, respectively. Similarly, the memory cells connected to the word line WL11 and each of the local bit lines LBL00, LBL10, and LBL20 are denoted by MC101, MC111, and MC121, respectively. The memory cells connected to the word line WL11 and each of the local bit lines LBL01, LBL11, and LBL21 are denoted by MC102, MC112, and MC122, respectively. The memory cells connected to the word line WL12 and each of the local bit lines LBL01, LBL11, and LBL21 are denoted by MC103, MC113, and MC123, respectively. The memory cells connected to the word line WL12 and each of the local bit lines LBL02, LBL12, and LBL22 are denoted by MC104, MC114, and MC124, respectively. The memory cells connected to the word line WL13 and each of the local bit lines LBL02, LBL12, and LBL22 are denoted by MC105, MC115, and MC125, respectively. This also applies to the memory cell MC (MC200 to MC205, MC210 to MC215, MC220 to MC225) in the plane PLN2.

Now, the connection between the word line WL and the global word line GWL will be described.

Figure 4:
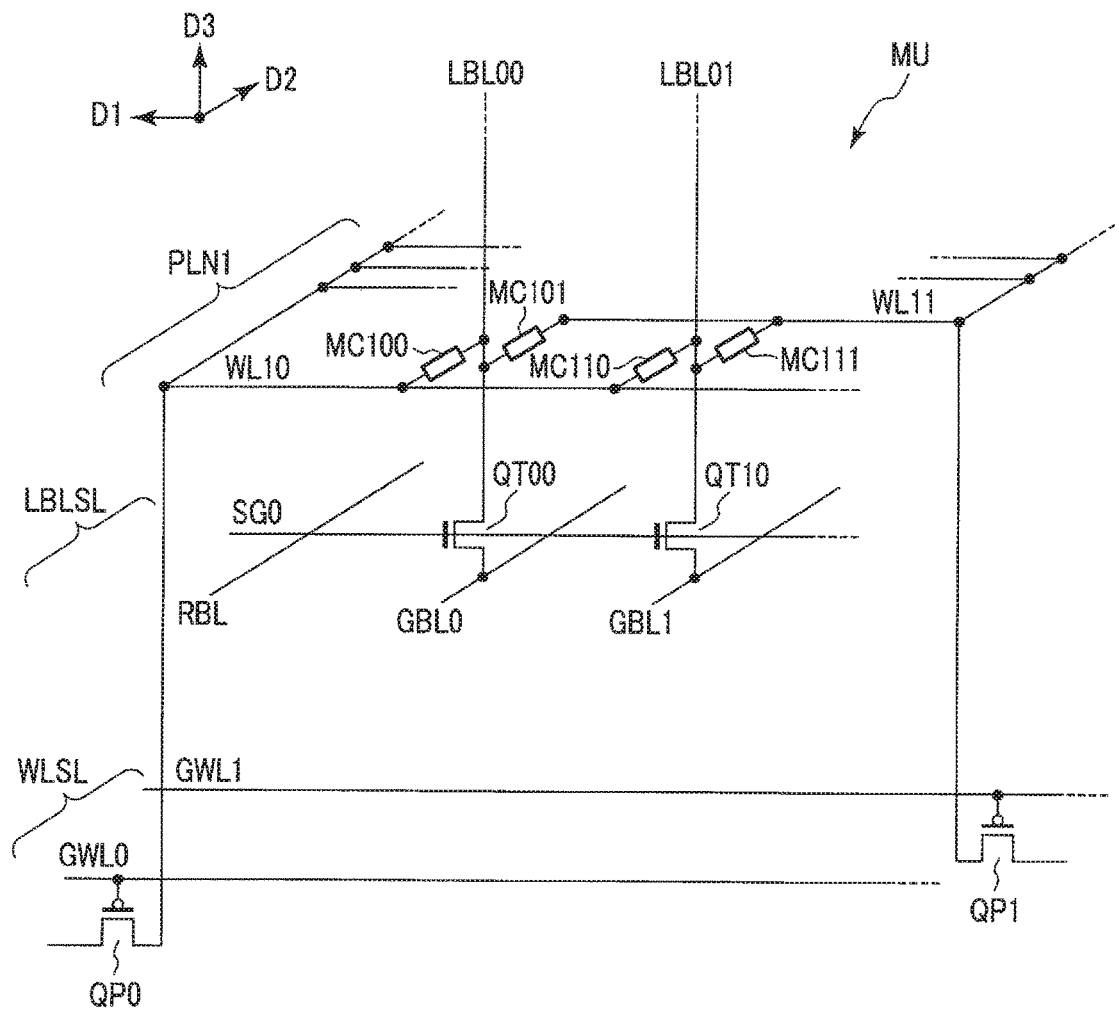
FIG. 4 is a perspective view depicting the layout of the memory unit provided in the semiconductor memory device according to the first embodiment.

FIG. 4 is a perspective view depicting a layout of the memory unit MU provided in the semiconductor memory device according to the first embodiment.

In the example in FIG. 4, for simplification of description, the plane PLN2 described in FIG. 3 is omitted, and the plane PLN1 and the LBL select layer LBLSL are depicted in a simplified manner. The local bit lines LBL00 and LBL01, the word lines WL10 and WL11, the memory cells MC100, MC101, MC110, and MC111, the global bit lines GBL0 and GBL1, the transistors QT00 and QT10, the select gate line SG0, and the reference bit line RBL, which are all depicted in FIG. 3 are depicted.

As depicted in FIG. 4, the ReRAM 1 includes a WL select layer WLSL arranged under the LBL select layer LBLSL. In the WL select layer WLSL, a plurality of P-channel MOS transistors QP (QP and QP1) connecting the word lines WL and the WL selector 13 together. More specifically, a first end of the transistor QP0 is connected to the word line WL10. A second end of the transistor QP0 is connected to the WL selector 13. A gate of the transistor QP0 is connected to the global word line GWL0. Similarly, a first end of the transistor QP1 is connected to the word line WL11. A second end of the transistor QP1 is connected to the WL selector 13. A gate of the transistor QP1 is connected to the global word line GWL1. A plurality of the global word lines GWL (GWL0 and GWL1) are arranged, for example, under the global bit lines GBL and the reference bit lines RBL so as to extend in the first direction D1.

The transistors QP0 and QP1 may be provided inside or outside the memory cell array 10. Moreover, the transistors QP0 and QP1 may be N-channel MOS transistors.

For example, when the memory cell MC100 is selected, the sense amplifier 15 selects the global bit line GBL0. The LBL selector 14 selects the select gate line SG0. As a result, local bit line LBL00 is selected. The WL selector 13 selects the global word line GWL0 to place the WL selector 13 and the selected word line WL10 in a connection state. The WL selector 13 then applies a needed voltage to the selected word line WL10. Therefore, the memory cell MC100 is selected which is connected to the local bit line LBL00 and the word line WL10.

The ReRAM 1 may select a plurality of the memory cells MC in the memory unit MU at a time. For example, with the sense circuits 20_0 to 20_n provided in association with the global bit lines GBL0 to GBLn, a plurality of the memory cells MC (MC100, MC110, MC120, . . . ) is selected at a time which corresponds to the select gate line SG0 and the word line WL10. Each of the sense circuits 20 reads data from the memory cells MC via the corresponding global bit lines GBL.

1.4 Structure of the Memory Unit

Now, a structure of the memory unit MU will be described.

Figure 5:
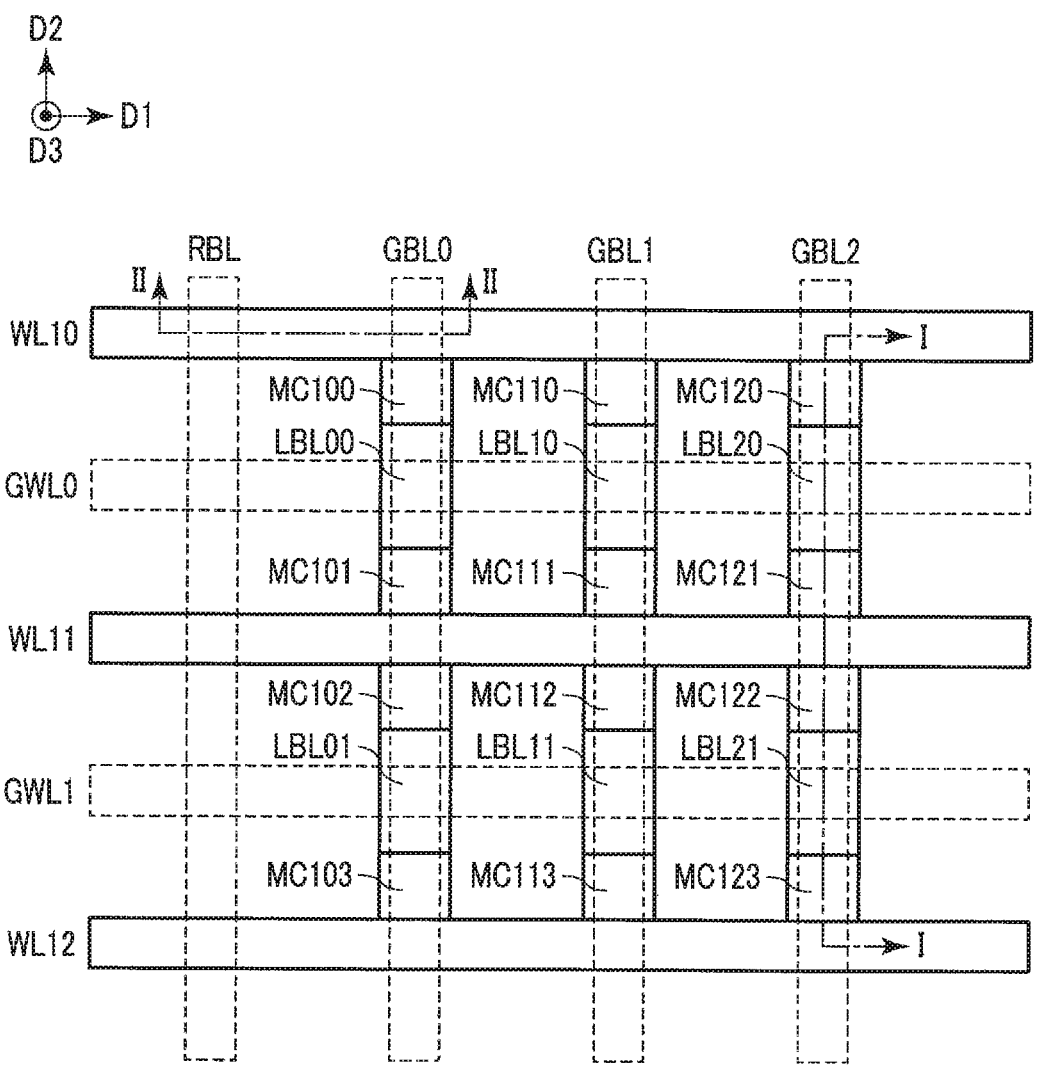
FIG. 5 is a top view of a plane PLN1 in the memory unit provided in the semiconductor memory device according to the first embodiment.

FIG. 5 is a top view of a plane in the memory unit MU provided in the semiconductor memory device according to the first embodiment. Interlayer insulating films in FIG. 5 are omitted.

Figure 6:
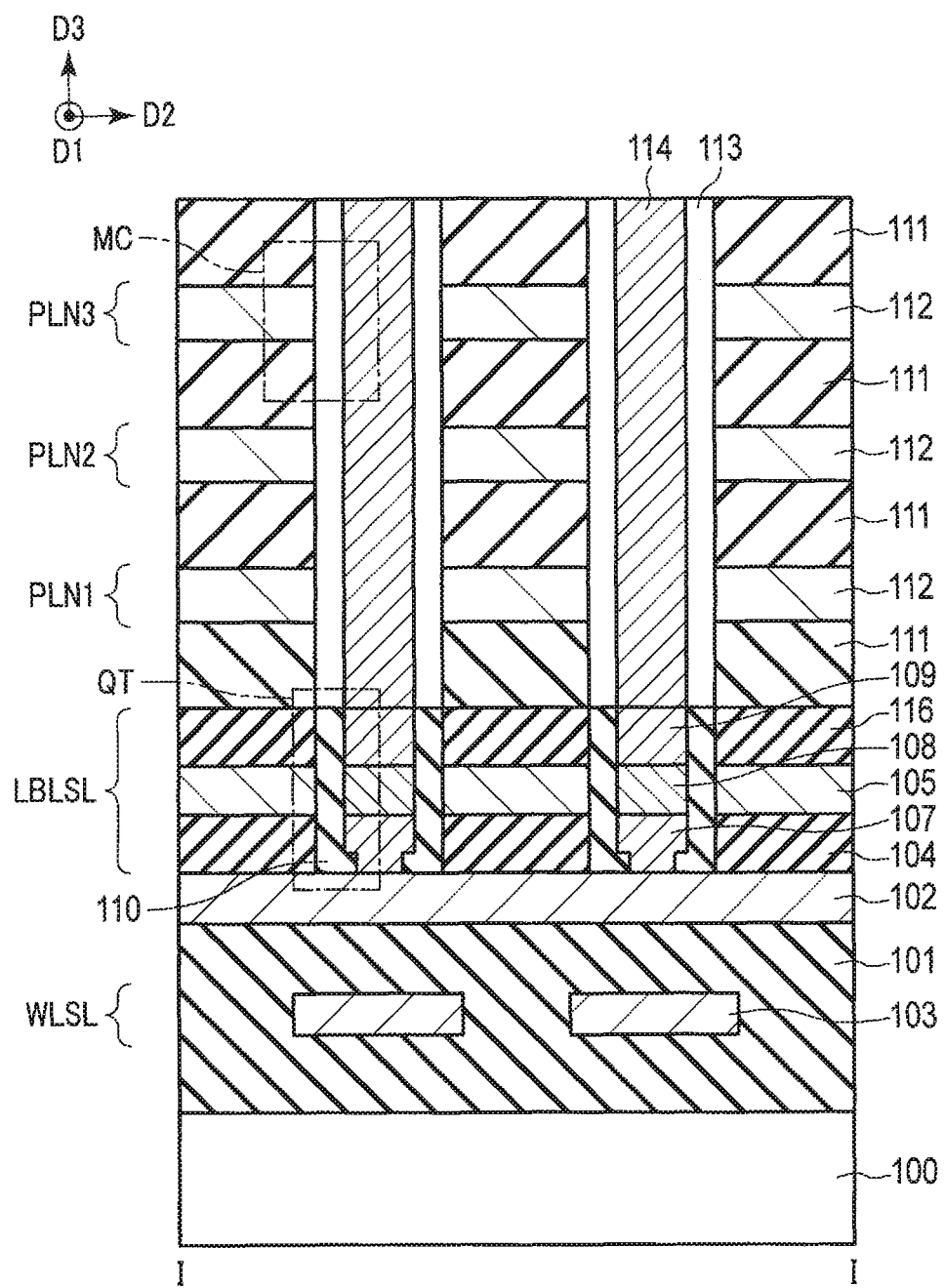
FIG. 6 is a sectional view of a memory cell array taken along line I-I in FIG. 5.
Figure 7:
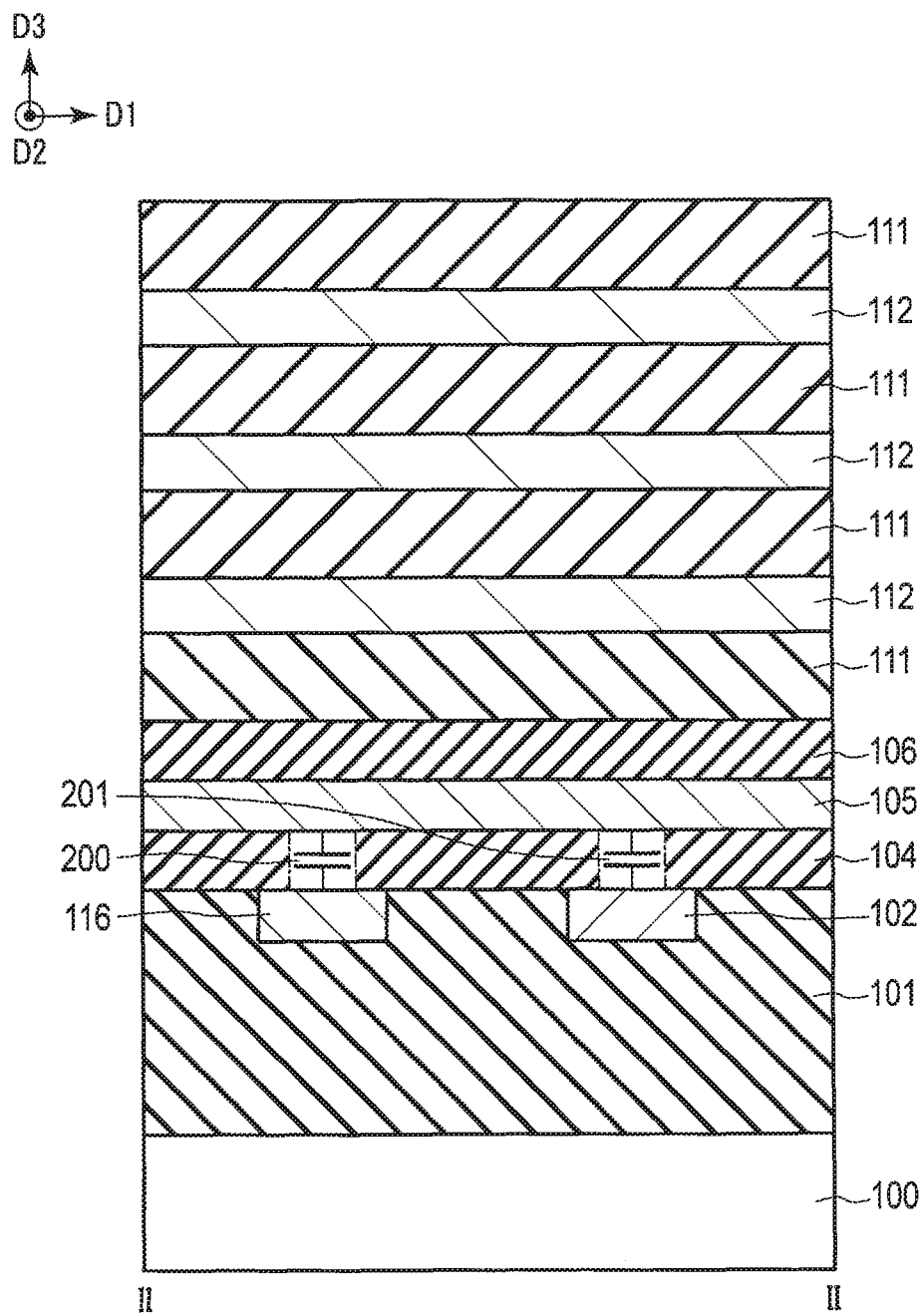
FIG. 7 is a sectional view of the memory cell array taken along line II-II in FIG. 5.

FIGS. 6 and 7 are sectional views of the memory cell array taken along line I-I and line II-II in FIG. 5. FIGS. 6 and 7 illustrate that three planes PLN (PLN1, PLN2, and PLN3) are formed.

As depicted in FIG. 5, in the plane PLN1, the word lines WL10 to WL12 are arranged so as to extend in the first direction D1. Under the word lines WL10 to WL12, global bit lines GBL0 to GBL2 extending in the second direction D2 are arranged. On the global bit lines GBL0 to GBL2, a plurality of the local bit lines LBL (LBL00, LBL01, LBL10, LBL11, LBL20, and LBL21) is provided which extends in the third direction D3. The memory cells MC (MC100 to MC103, MC110 to MC113, and MC120 to MC123) are provided so as to connect the local bit lines LBL and the word lines WL together. No local bit line LBL or memory cell MC is provided above the reference bit line RBL, which is not electrically connected to the local bit line LBL or memory cell MC. In the example in FIG. 5, below the local bit lines LBL (LBL00 and LBL10), the global word lines GWL (GWL0 and GWL1) are provided which extend in the first direction D1. The global word lines GWL may be provided below the word lines WL and may be optionally arranged.

Now, a sectional structure of the memory unit MU taken along line I-I will be described.

As depicted in FIG. 6, a pillar of the local bit lines LBL is formed along the third direction D3. The pillar is connected to all interconnect layers corresponding to the word lines WL in the respective planes PLN, via a resistance layer functioning as the memory cell MC. A bottom surface of the pillar is connected to the thin film transistor QT provided on the interconnect layer corresponding to the global bit line GBL.

More specifically, an insulating layer 101 is provided on the semiconductor substrate 100. For example, a silicon oxide film ($SiO_2$) is used for the insulating layer 101. In the insulating layer 101, an interconnect layer 103 is provided which extends in the first direction D1. The interconnect layer 103 may be, for example, polysilicon (poly-Si), aluminum (Al), or tungsten (W). The interconnect layer 103 functions as a global word line GWL. On the insulating layer 101, an interconnect layer 102 is provided which extends in the second direction D2. The interconnect layer 102 functions, for example, as a global bit line GBL. For the interconnect layer 102, for example, aluminum (Al) or tungsten (W) is used. On the interconnect layer 102, an insulating layer 104, an interconnect layer 105, and an insulating layer 106 are sequentially stacked. The interconnect layer 105 extends along the first direction D1, and functions, for example, as a gate line for the transistor QT. For the interconnect layer 105, for example, a semiconductor layer ($n^+$ poly-Si) is used.

A hole is formed so as to penetrate the insulating layer 104, the interconnect layer 105, and the insulating layer 106 and to reach the interconnect layer 102. On a side surface of the hole, an insulating layer 110 is provided which functions as a gate insulating film for the transistor QT. The hole is internally provided with a semiconductor layer ($n^+$ poly-Si) 107 functioning as a source or a drain of the transistor QT, a semiconductor layer ($p^-$ poly-Si) 108 in which a channel of the transistor QT is formed, and a semiconductor layer ($n^+$ poly-Si) 109 functioning as a source or a drain of the transistor QT; the semiconductor layers 107, 108, 109 are arranged in this order from below.

On the insulating layer 106, four insulating layers 111 and three interconnect layers 112 are alternately stacked; the interconnect layers 112 function as the word lines WL in the planes PLN1, PLN2, and PLN3, respectively, arranged in this order from below. For the interconnect layers 112, for example, aluminum (Al) or tungsten (W) is used.

A hole is formed which penetrates the four insulating layers 111 and the three interconnect layers 112 and which reaches the semiconductor layer 109. On a side surface of the hole, a resistance layer 113 is provided which functions as the memory cell MC. The hole is internally filled with a semiconductor layer ($n^+$ poly-Si) 114 functioning as the local bit lines LBL.

The resistance layer 113 contains, for example, chalcogenide, a metal oxide, CMO (CaMnO), or a material having a resistance value varied in a nonvolatile manner by an applied voltage. More specifically, for example, the resistance layer 113 is formed to have a three-layer structure including an upper electrode, a metal oxide with a variable resistance value, and a lower electrode. For example, platinum (Pt) may be used as the upper and lower electrodes, and titanium oxide ($TiO_x$) may be used as the metal oxide. Moreover, the metal oxide may be, for example, hafnium oxide ($HfO_x$), zirconium oxide ($ZrO_x$), tungsten oxide ($WO_x$), nickel oxide ($NiO_x$), cobalt oxide ($CoO_x$), cobalt aluminum oxide ($CoAlO_x$), manganese oxide ($MnO_x$), zinc manganese tetroxide ($ZnMn_2O_4$), zinc oxide ($ZnO_x$), tantalum oxide ($TaO_x$), niobium oxide ($NbO_x$), hafnium silicon oxide ($HfSiO_x$), or hafnium aluminum oxide ($HfAlO_x$).

The upper electrode may be, for example, tantalum carbonitride (TaCN), titanium carbonitride (TiCN), ruthenium (Ru), ruthenium oxide (RuO), platinum (Pt), titanium-rich titanium oxide ($TiO_x$), titanium aluminum nitride (TiAlN), tantalum aluminum nitride (TaAlN), titanium silicon nitride (TiSiN), tantalum silicon nitride (TaSiN), iridium oxide ($IrO_x$), or doped polysilicon.

The lower electrode may be oxygen-rich metal, for example, oxygen-containing titanium nitride (Ti(O)N), oxygen-containing tantalum nitride (Ta(O)N), titanium nitride (TiN), or tantalum nitride (TaN). The upper and lower electrodes may have a film thickness of, for example, 1 nm or more. The metal oxide may have a thickness of 2 nm to 20 nm.

Furthermore, instead of the metal oxide, a solid electrolyte may be used. The solid electrolyte may contain silver (Ag) or copper (Cu). In this case, for example, a compound expressed by $A_x(MB2)_{1-x}$ may be used as one electrode. In this case, A may be silver (Ag) or copper (Cu), B may be sulfur (S) or cesium (Se), M is transition metal such as Ta, vanadium (V), or Ti, and x may be within the range of 0.1 to 0.7. More specifically, one electrode may be $Ag_x$ $(TaS2)_{1-x}$. The other electrode may contain W, nickel (Ni), molybdenum (Mo), Pt, or metal silicide.

Furthermore, the solid electrolyte may contain, for example, TaO, germanium selenium (GeSe), or germanium sulfide (GeS). Moreover, the solid electrolyte may be, for example, Cu/TaO/W, Ag/GeSe/W, Cu/GeSe/W, Cu/GeS/W, or Ag/GeS/W.

Moreover, the same material as that of the lower electrode or the upper electrode may be used for the word lines WL (interconnect layers 112) and the local bit lines LBL (conductive layers 114). Consequently, the resistance layer 113 may be formed exclusively of a material having a resistance value that can be varied in a nonvolatile manner by an applied voltage.

Now, a sectional structure of the memory unit MU taken along line II-II will be described with focus placed on arrangement of the global lines GL, the reference bit lines RBL, and the select gate lines SG. In the example in FIG. 7, reference numerals 200 and 201 each illustrate a capacitance-between-interconnects, and actually no capacitive element is provided.

As depicted in FIG. 7, an interconnect layer 116 functioning as the reference bit line RBL is arranged in the same layer as the interconnect layer 102 functioning as the global bit line GBL. Like the interconnect layer 102, the interconnect layer 116 extends in the second direction D2. The interconnect layer 105 extending in the first direction D1 is arranged on the interconnect layers 102 and 116 via the insulating layer 104. Thus, a capacitance-between-interconnects 201 is generated at a position where the interconnect layers 105 and 102 three-dimensionally intersect via the insulating layer 104. Similarly, a capacitance-between-interconnects 200 is generated at a position where the interconnect layers 105 and 116 three-dimensionally intersect via the insulating layer 104. In the present embodiment, the interconnect layers 102 and 116 are provided such that the capacitances-between-interconnects 200 and 201 have approximately the same value.

More specifically, the interconnect layers 102 and 116 have approximately the same width. The distance between the interconnect layer 102 and the interconnect layer 105 (the film thickness of the insulating layer 104) is approximately the same as the distance between the interconnect layer 116 and the interconnect layer 105. An insulating material (insulating layer 104) between the interconnect layer 102 and the interconnect layer 105 has approximately the same dielectric constant as that of an insulating material (insulating layer 104) between the interconnect layer 116 and the interconnect layer 105. Furthermore, the interconnect layers 102 and 116 have approximately the same height and are formed of the same material. Consequently, the interconnect layers 102 and 116 are configured to have approximately the same interconnect resistance. That is, the interconnect layers 102 and 116 are arranged in the same layer and have substantially the same sectional shape.

Moreover, interconnect length and interconnect resistance from the position where the interconnect layers 105 and 102 three-dimensionally intersect via the insulating layer 104 to an input terminal of the sense circuit 20 may be approximately the same as interconnect length and interconnect resistance from the position where the interconnect layers 105 and 116 three-dimensionally intersect via the insulating layer 104 to the input terminal of the sense circuit 20. Then, noise traveling from the interconnect layer 105 to the interconnect layers 102 and 116 is input to the sense circuit 20 substantially at the same timing regardless of whether the noise passes through the interconnect layer 102 or through the interconnect layer 116 (noise in the interconnect layer 102 and noise in the interconnect layer 116 are input to the sense circuit 20 as a common-mode noise).

As is the case with the interconnect layer 105, capacitances-between-interconnects are generated between the interconnect layer 102 and the interconnect layer 103 arranged under the interconnect layer 102 (global word line GWL) and between the interconnect layer 116 and the interconnect layer 103. Therefore, the distance between the interconnect layer 102 and the interconnect layer 103 is set approximately the same as the distance between the interconnect layer 116 and the interconnect layer 103 so that the capacitance-between-interconnects between the interconnect layer 102 and the interconnect layer 105 is approximately the same as the capacitance-between-interconnects between the interconnect layer 116 and the interconnect layer 105.

1.5 Configuration of the Sense Circuit

Now, a configuration of the sense circuit 20 will be described.

FIG. 8 is a block diagram of the sense circuit 20 provided in the semiconductor memory device according to the first embodiment.

As depicted in FIG. 8, the sense circuit 20 comprises, for example, a three-stage amplifying differential amplifier having a function to cancel an input referred offset. More specifically, the sense circuit 20 includes differential amplifiers 23a, 23b, and 23c, capacitive elements CP10 to CP13, switching elements ST10 to ST12. The differential amplifiers 23a and 23b are fully differential amplifier circuits of a differential output type. The differential amplifier 23c is, for example, an OTA (operational trans conductance amplifier) of a differential input type, and is of a single output type.

A first input terminal of the differential amplifier 23a is connected to the global bit line GBL via the capacitive element CP10, and a second input terminal of the differential amplifier 23a is connected to the reference bit line RBL via the capacitive element CPU. A first output terminal of the differential amplifier 23a is connected to a first input terminal of the differential amplifier 23b via the capacitive element CP12, and a second output terminal of the differential amplifier 23a is connected to a second input terminal of the differential amplifier 23b via the capacitive element CP13. A first output terminal of the differential amplifier 23b is connected to a first input terminal of the differential amplifier 23c, and a second output terminal of the differential amplifier 23b is connected to a second input terminal of the differential amplifier 23c.

The switching element ST10 connects the first input terminal and first output terminal of the differential amplifier 23a together. The switching element ST11 connects the second input terminal and second output terminal of the differential amplifier 23a together. The switching element ST12 connects the first input terminal and first output terminal of the differential amplifier 23b together. The switching element ST13 connects the second input terminal and second output terminal of the differential amplifier 23b together. A first-stage input offset comparator comprises the differential amplifier 23a, the capacitive elements CP10 and CPU, and the switching elements ST10 and ST11. A second-stage input offset comparator comprises the differential amplifier 23b, the capacitive elements CP12 and CP13, and the switching elements ST12 and ST13.

The number of differential amplifier stages can be optionally set according to a needed gain and the like. Furthermore, in the example in FIG. 8, the first-stage differential amplifier 23a is of the differential output type but may be of, for example, a single output type. Additionally, a final stage in the sense circuit 20 may be an inverter or a latch circuit. In addition, an input to the first-stage differential amplifier 23a is decoupled by the capacitive elements CP10 and CPU, and thus, an input voltage may be different from a power supply voltage for the differential amplifier 23a. For example, the power supply voltage may be lower than the input voltage.

Furthermore, the sense circuit 20 may include two or more differential amplifier stages with a decoupled input. In this case, the power supply voltages for the two differential amplifiers may be different from each other, and transistors included in the two differential amplifiers have different rated voltages. For example, the second-stage differential amplifier may have a lower power supply voltage and a lower transistor rated voltage then the first-stage differential amplifier. Furthermore, the second and subsequent differential amplifiers may have the same power supply voltage as that for a reception circuit (for example, the controller 11) for data output from the sense circuit 20. In this case, a level shifter may be omitted which adjusts data output from the sense circuit 20.

Moreover, the sense circuit 20 has an input offset cancel function. Thus, when the global bit line GBL is precharged, the reference bit line RBL may be set to a potential different from the potential of the global bit line GBL. That is, the reference bit line RBL need not be precharged.

Now, a circuit configuration of the differential amplifier 23a will be described.

FIG. 9 is a circuit diagram of the differential amplifier 23a provided in the semiconductor memory device according to the first embodiment. The differential amplifier 23b may have the same configuration. Furthermore, the differential amplifiers 23a and 23b may have different gains. Moreover, the circuit configurations of the differential amplifiers 23a and 23b are not limited to the circuit configurations in FIG. 9.

As depicted in FIG. 9, the differential amplifier 23a comprises P-channel MOS transistors QP10 and QP11 and N-channel MOS transistors QN10 to QN12.

A source of the transistor QP10 is connected to a source of the transistor QP11 such that a power supply voltage VDD is applied to the source of the transistor QP10. A drain of the transistor QP10 is connected to gates of the transistors QP10 and QP11 and to a drain of the transistor QN10. A drain voltage of the transistor QP10 is output as an output voltage Vout1. An input voltage Vin1 is applied to a gate of the transistor QN10. A source of the transistor QN10 is connected to a source of the transistor QN11 and to a drain of the transistor QN12. A ground voltage VSS is applied to the source of the transistor QN12. A signal for controlling a current flowing to the ground voltage VSS is input to a gate of the transistor QN12, for example, by the controller 11. A drain of the transistor QP11 is connected to a drain of the transistor QN11. A drain voltage of the transistor QP11 is output as an output voltage Vout2. An input voltage Vin2 is applied to a gate of the transistor QN11.

1.6 Connection Between the Sense Circuit and the Current Source

Now, connection between the sense circuit 20 and the current source 16 will be described.

Figure 10:
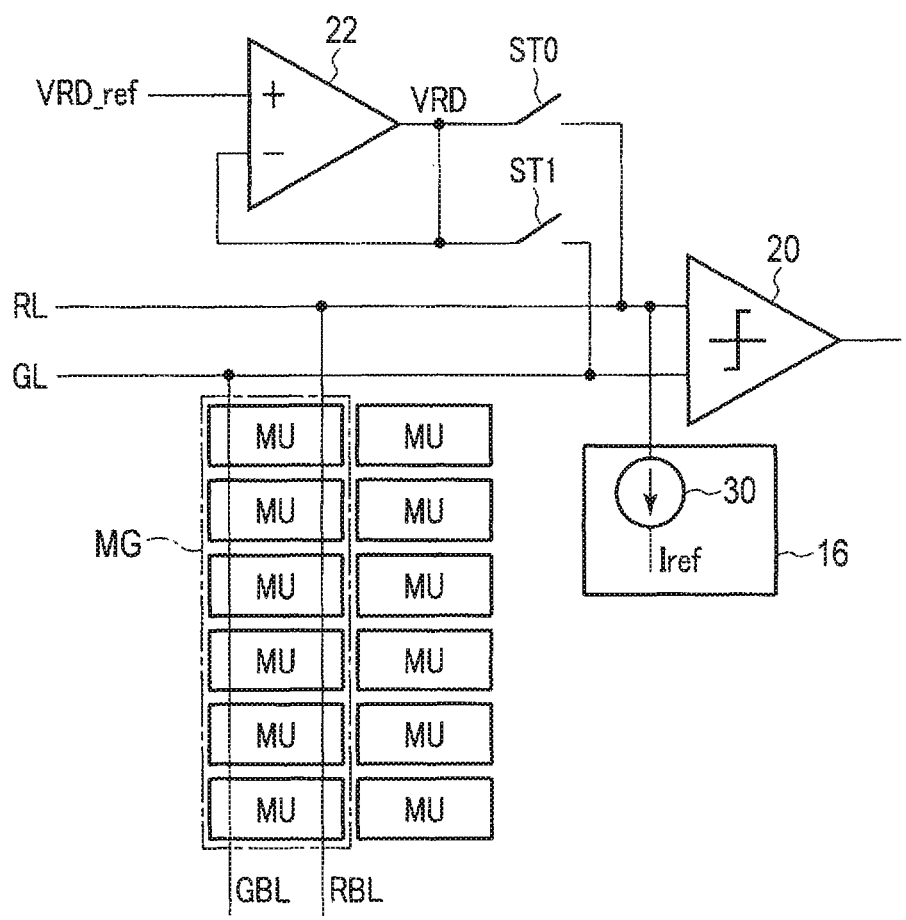
FIG. 10 is a diagram of the sense circuit and a current source provided in the semiconductor memory device according to the first embodiment.

FIG. 10 is a diagram depicting the sense circuit and the current source provided in the semiconductor memory device according to the first embodiment. In the example in FIG. 10, one memory group MG includes six memory units MU. Furthermore, for simplification of description, one global bit line GBL and one reference bit line RBL are depicted, and the multiplexers 21a and 21b are omitted.

As depicted in FIG. 10, the current source 16 includes a current circuit 30 corresponding to the sense circuit 20. The current circuit 30, for example, during a read operation, supplies the reference current Iref to the sense circuit 20. The current circuit 30 is connected to the reference line RL at a position closer to the sense circuit 20 than to the reference bit line RBL. One current circuit 30 may correspond to a plurality of sense circuits 20 and be connected to a plurality of the reference lines RL.

The global line GL and the reference line RL are connected to a differential amplifier 22. The differential amplifier 22 is used, for example, during a read operation to precharge the global line GL and the reference line RL with a read voltage VRD. For example, the differential amplifier 22 may be provided in the sense amplifier 15 or in a voltage generator (not depicted in the drawings). More specifically, a voltage VRD_ref from the controller 11 is input to a non-inverting input terminal of the differential amplifier 22, and an inverting input terminal is connected to an output terminal. The differential amplifier 22 outputs the read voltage VRD according to the voltage VRD_ref. The differential amplifier 22 is connected to the reference line RL via a switching element ST0 and to the global line GL vial a switching element ST1.

For example, during a read operation, first, the controller 11 sets the switching elements ST0 and ST1 to an on state to precharge each of the global line GL (and the selected global bit line GBL) and the reference line RL (and the selected reference bit line RBL) with the read voltage VRD. At this time, no reference current Iref is passed through the current circuit 30.

Then, the controller 11 sets the switching elements ST0 to ST1 to, for example, an off state. The sense circuit 20 compares the reference current Iref flowing from the reference line RL to the current circuit 30 with a cell current Icell flowing to the selected memory cell MC via the global line GL and the global bit line GBL to read data from the selected memory cell MC.

1.7 Configuration of the Current Circuit

Now, a configuration of the current circuit 30 will be described.

Figure 11:
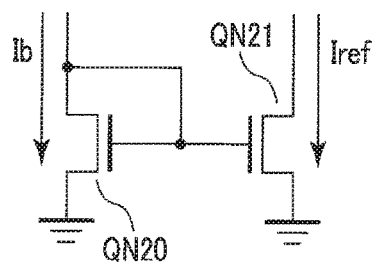
FIG. 11 is a circuit diagram of a current circuit provided in the semiconductor memory device according to the first embodiment.

FIG. 11 is a circuit diagram of the current circuit 30 provided in the semiconductor memory device according to the first embodiment.

As depicted in FIG. 11, for example, the current circuit 30 may include a current mirror circuit. More specifically, for example, the current circuit 30 includes N-channel MOS transistors QN20 and QN21 to form a current mirror. A drain of the transistor QN21 is connected to the reference line RL. A flow of a drain current Ib through the transistor QN20 leads to a corresponding flow of the reference current Iref through the transistor QN21. The drain current Ib is fed from the current source 16 or a BGR circuit (band-gap reference circuit) (not depicted in the drawings) provided in the voltage generator under the control of the controller 11. When the transistors QN20 and QN21 have substantially the same transistor size and transistor characteristics, the drain current Ib is substantially equal to the reference current Iref.

1.8 Effects of the Present Embodiment

The configuration according to the present embodiment allows reliability of the semiconductor memory device to be enhanced. This effect will be described in detail.

The ReRAM reads data, for example, by comparing the cell current Icell flowing through the selected memory cell MC with the reference current Iref. Thus, if noise is superimposed on one of the cell current Icell or the reference current Iref, the sense amplifier may wrongly sense (wrongly read). More specifically, a cause of the noise may be transmission of fluctuation of voltages of control signals transmitted through interconnects arranged in an upper layer and a lower layer close to the global bit line GBL, that is, the select gate line SG and the global word line GWL, or the noise superimposed on the control signal, to the global bit line GBL as noise as a result of capacitive coupling. Then, the sense circuit 20 may wrongly sense data stored in the memory cell MC due to noise from the global bit line GBL.

Figure 12:
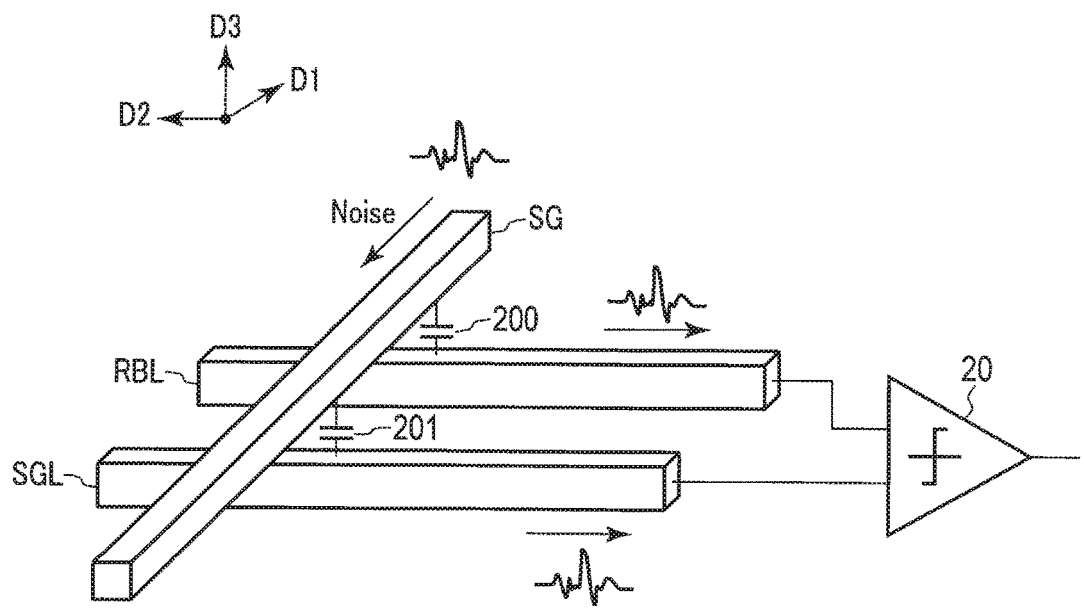
FIG. 12 is a diagram illustrating an example of common mode noise input to the sense circuit.

In contrast, in the configuration according to the present embodiment, the reference bit line RBL is arranged in the same layer in which the global bit line GBL is arranged and has substantially the same interconnect shape (height and width) as that of the global bit line GBL. Moreover, the distance between the global bit line GBL and the select gate line SG is set approximately the same as the distance between the reference bit line RBL and the select gate line SG. Consequently, as depicted in FIG. 12, the capacitance-between-interconnects 201 between the select gate line SG and the global bit line GBL is approximately the same as the capacitance-between-interconnects 200 between the select gate line SG and the reference bit line RBL.

As a result, noise transmitted from the select gate line SG to the global bit line GBL and noise transmitted from the select gate line SG to the reference bit line RBL are input to the sense circuit 20 as common-mode noise. The sense circuit 20 of the differential input type allows the common-mode noise to be cancelled. Therefore, the sense circuit 20 allows read data to be determined with the adverse effect of noise from the select gate line SG reduced. Therefore, the possibility of misread decreases, allowing the reliability of the semiconductor memory device to be enhanced.

Moreover, in the present embodiment, the global bit line GBL (and the global line GL) and the reference bit line RBL (and the reference line RL) involve approximately the same length and the same interconnect resistance from the position where the select gate line SG three-dimensionally intersects the global bit line GBL and the reference bit line RBL via the insulating layer 104 to the input terminal of the sense circuit 20. Consequently, when the sense circuit 20 treats (cancels) the noise from the select gate line SG as common-mode noise, a difference in input timing can be suppressed. Thus, the sense circuit 20 can accurately treat the noise from the select gate line SG as common-mode noise, enabling a reduction in the possibility of erroneous sensing. Therefore, the reliability of the semiconductor memory device can be enhanced.

Moreover, in the configuration according to the present embodiment, the sense circuit 20 can similarly cancel noise from the global word line GWL as common-mode noise. More specifically, the distance between the global bit line GBL and the global word line GWL is set approximately the same as the distance between the reference bit line RBL and the global word line GWL. That is, a capacitance-between-interconnects between the global word line GWL and the global bit line GBL is set approximately the same as a capacitance-between-interconnects between the global word line GWL and the reference bit line RBL. Consequently, the reliability of the semiconductor memory device can be enhanced.

Moreover, the degree of freedom of the power supply voltage for the differential amplifier is increased by the use of a differential amplifier configured such that the capacitive elements are connected in series with the input terminals of the sense circuit 20. Thus, the power supply voltage for the differential amplifier can be selected without constraints on the transistor rated voltage. For example, a power supply voltage lower than the read voltage VRD can be used for the differential amplifier. Therefore, the sense circuit 20 can be configured using a transistor with a low rated voltage (that is, with a small size).

2. Second Embodiment

Now, a second embodiment will be described. In the second embodiment, two examples are illustrated in which the second embodiment is different from the first embodiment in the arrangement of the global bit line GBL and the reference bit line RBL connected to the sense circuit 20. Only differences from the first embodiment will be described.

2.1 First Example

First, a first example of the second embodiment will be described. In the first example, a case will be described where the reference bit line RBL is arranged in a dummy memory unit (hereinafter referred to as a "dummy unit DU"). In the dummy unit DU, the select gate lines SG, the global word lines GWL, and the reference bit lines RBL are arranged, and no global bit lines GBL are arranged. Furthermore, in the dummy unit DU, for example, the thin film transistors QT or the memory cells MC need not be arranged.

Figure 13:
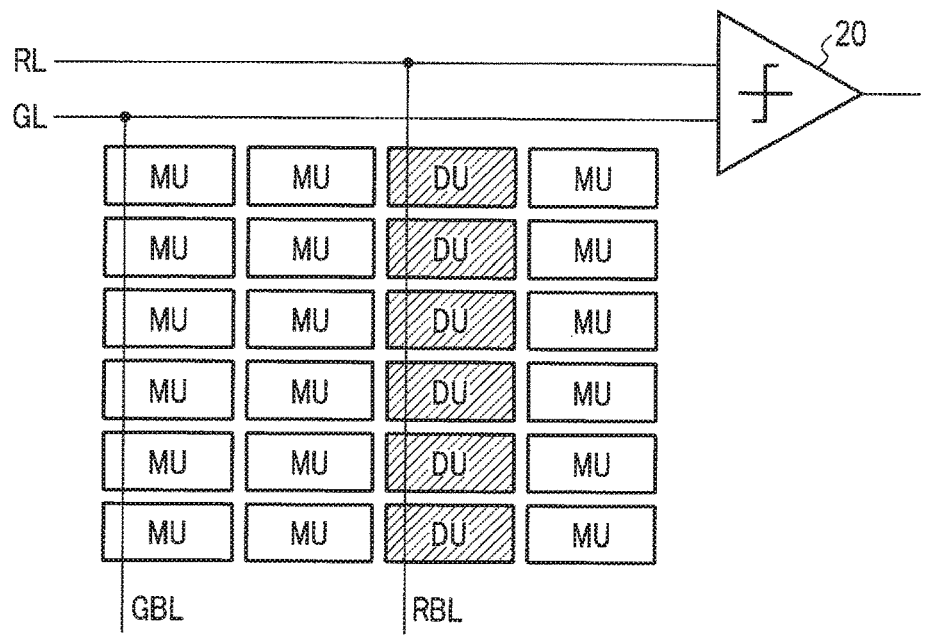
FIG. 13 is a block diagram of the memory cell array and the sense circuit provided in the semiconductor memory device according to a first example of a second embodiment.

FIG. 13 is a block diagram of the memory cell array 10 and the sense circuit 20 provided in the semiconductor memory device according to the first example of the second embodiment. As is the case with FIG. 10 for the first embodiment, FIG. 13 depicts one global bit line GBL and one reference bit line RBL. Furthermore, the differential amplifier 22, the current circuit 30, and the multiplexers 21a and 21b are omitted.

As depicted in FIG. 13, the memory cell array 10 includes the dummy units DU. That is, the memory cell array 10 includes a dummy memory group MG including the dummy units DU. The reference line RL connected to one sense circuit 20 is connected to the reference bit line RBL arranged in a dummy unit DU area. The global line GL is connected to the global bit line GBL arranged in the memory units MU (memory group MG). In this case, the select gate lines SG arranged in the memory units MU corresponding to the global bit line GBL may be the same as or different from the select gate lines SG arranged in the dummy units DU. For example, if the same noise is superimposed on control signals on the select gate lines SG due to the LBL selector 14, the controller 11 connected to the LBL selector 14, the voltage generator connected to the LBL selector 14, or the like, the sense circuit 20 can treat (cancel) noise on the select gate lines SG transmitted to the global line GL and the reference line RL as common-mode noise.

2.2 Second Example

Now, a second example of the second embodiment will be described. In the second example, a case will be described in which the global bit line GBL and the reference bit line RBL connected to the one sense circuit 20 are arranged in different memory groups MG.

Figure 14:
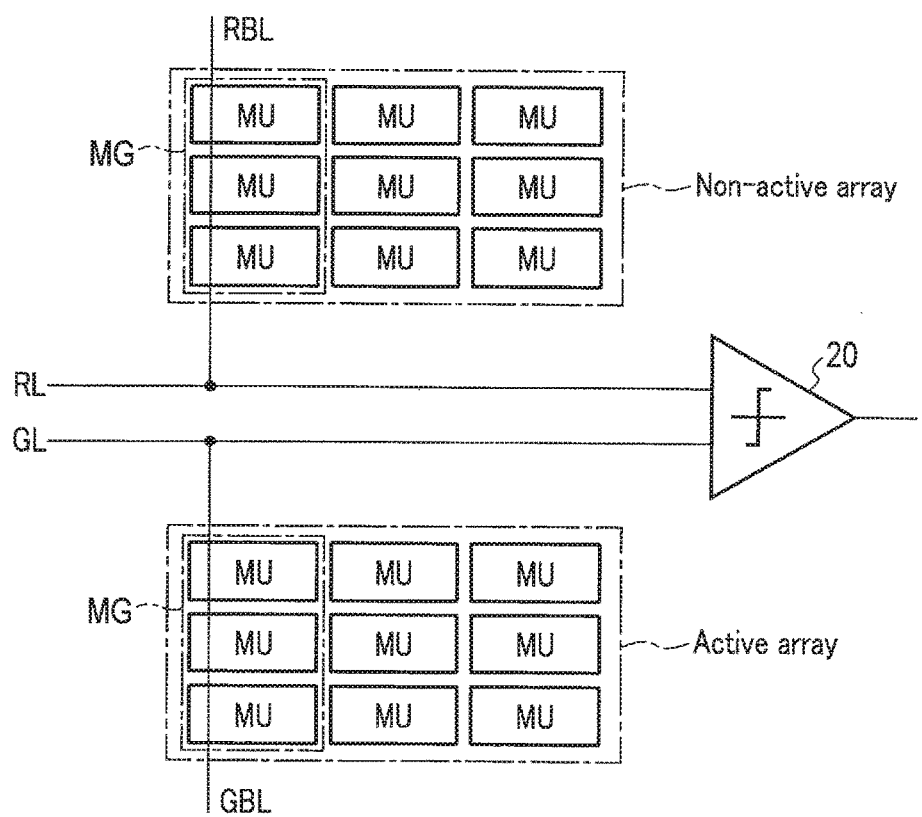
FIG. 14 is a block diagram of the memory cell array and the sense circuit provided in the semiconductor memory device according to a second example of the second embodiment.

FIG. 14 is a block diagram of the memory cell array 10 and the sense circuit 20 provided in the semiconductor memory device according to the second example of the second embodiment. The example in FIG. 14 illustrates a case where the memory group MG includes three memory units MU. Furthermore, in the memory cell array 10 in the present example, a set of selected memory groups MG is referred to as an active array, and a set of unselected memory groups MG is referred to as a non-active array.

As depicted in FIG. 14, the global bit line GBL arranged in the active array is connected to the global line GL. On the other hand, the reference bit line RBL arranged in the non-active array is connected to the reference line RL. Furthermore, as is the case with the first example, the select gate lines SG three-dimensionally intersecting the selected global bit line GBL may be the same as or different from the select gate lines SG three-dimensionally intersecting the selected reference bit line RBL.

2.3 Effects of the Present Embodiment

The arrangement of the global bit lines GBL and the reference bit lines RBL in the present embodiment can be applied to the first embodiment. This allows production of effects similar to the effects of the first embodiment.

3. Third Embodiment

Now, a third embodiment will be described. The third embodiment illustrates 12 examples where the arrangement of the global bit lines GBL and the reference bit line RBL in the memory unit MU is different from the arrangement in the first embodiment.

3.1 First Example

Now, a third embodiment will be described. In the first example, a case will be described in which the global bit line GBL and the reference bit line RBL are arranged in one memory unit MU.

Figure 15:
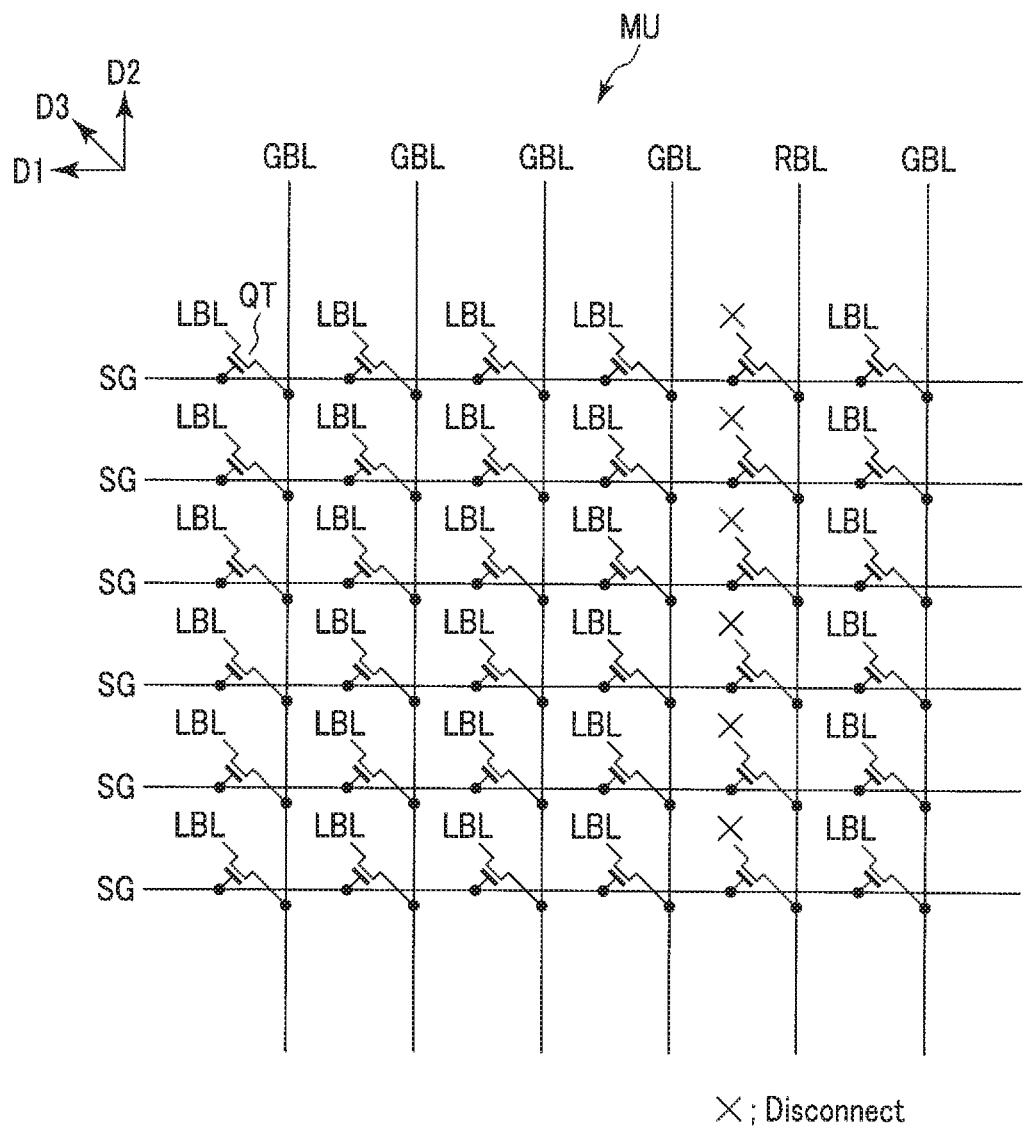
FIG. 15 is a schematic diagram depicting a layout of global bit lines and a reference bit line in a memory cell array provided in the semiconductor memory device according to a first example of a third embodiment.

FIG. 15 is a schematic diagram depicting a layout of the global bit lines GBL and the reference bit line RBL in the memory unit MU provided in the semiconductor memory device according to the first example of the third embodiment.

As depicted in FIG. 15, in the same memory unit MU, the global bit lines GBL and the reference bit line RBL are arranged so as to extend in the second direction D2. The select gate lines SG are arranged so as to extend in the first direction D1. The thin film transistors QT are vertically arranged along the third direction D3. In the first example, the transistors QT are provided on the global bit lines GBL and the reference bit lines RBL. A first end of each of the transistors QT is connected to the global bit line GBL or the reference bit line RBL. The transistor QT connected to the global bit line GBL at the first end of the transistor QT is connected to the local bit line LBL at a second end of the transistor QT. On the other hand, the transistor QT connected to the reference bit line RBL at the first end of the transistor QT is not connected to the local bit line LBL at the second end of the transistor QT (FIG. 15 depicts non-connections with X).

For example, the local bit lines LBL on the reference bit line RBL may be discarded or an insulating layer may be provided between the second end of the transistor QT and the local bit line LBL to electrically disconnect the second end of the transistor QT from the local bit line LBL. Gates of the transistors QT arranged along the second direction D2 are connected together by the single select gate line SG. That is, the single select gate line SG connects both to the gate of each transistor QT connected to the global bit line GBL at the first end of the transistor QT and to the gate of the transistor QT connected to the reference bit line RBL at the first end of the transistor QT.

3.2 Second Example

Now, a second example of the third embodiment will be described. Only differences from the first example will be described below.

FIG. 16 is a schematic diagram depicting a layout of the global bit lines GBL and the reference bit line RBL in the memory unit MU provided in the semiconductor memory device according to the second example of the third embodiment.

As depicted in FIG. 16, in the second example, the transistors QT provided on the reference bit line RBL in FIG. 15 for the first example of the third embodiment are discarded.

3.3 Third Example

Now, a third example of the third embodiment will be described. Only differences from the first and second examples will be described below.

Figure 17:
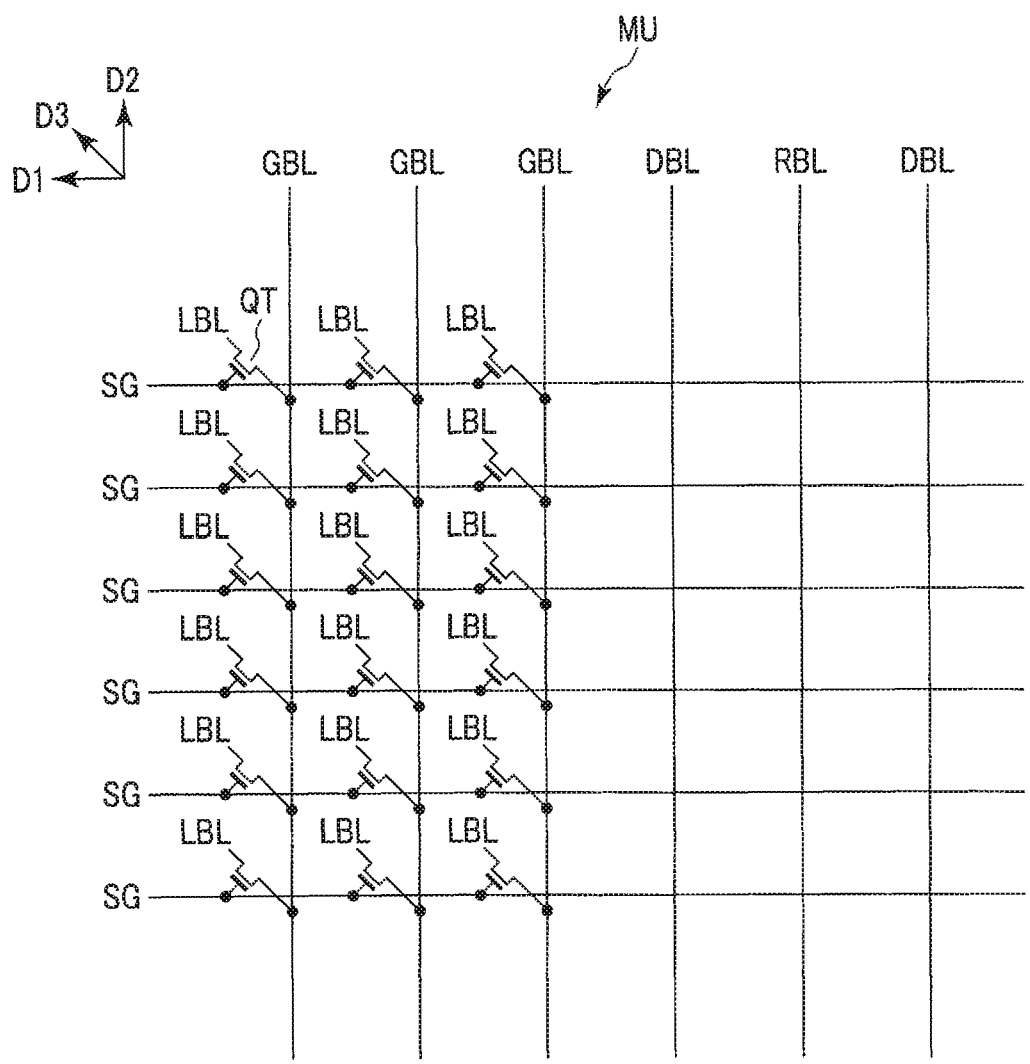
FIG. 17 is a schematic diagram depicting a layout of the global bit lines and the reference bit line in the memory cell array provided in the semiconductor memory device according to a third example of the third embodiment.

FIG. 17 is a schematic diagram depicting a layout of the global bit lines GBL and the reference bit line RBL in the memory unit MU provided in the semiconductor memory device according to the third example of the third embodiment.

As depicted in FIG. 17, in the third example, dummy bit lines DBL are arranged on both sides of the reference bit line RBL so as to extend in the second direction D2. The dummy bit lines DBL function as shield lines for shielding noise transmitted to the global bit lines GBL or the reference bit line RBL from, for example, another interconnect provided in the same layer (for example, an unselected global bit line GBL, an unselected reference bit line RBL). The dummy bit lines DBL are arranged in the same layer in which each global bit line GBL and the reference bit line RBL are arranged. No transistors QT are provided on the dummy bit lines DBL as is the case with the reference bit line RBL. A voltage VUB (for example, the ground voltage VSS, the power supply voltage VDD, or another fixed voltage) is applied to the dummy bit lines DBL.

For example, unselected reference bit lines RBL may be used as the dummy bit lines DBL. In this case, for the multiplexer 21*b* in FIG. 2 for the first embodiment, the reference bit line RBL is connected to the reference line RL, and the voltage VUB is applied to the unselected reference bit line RBL.

3.4 Fourth Example

Now, a fourth example of the third embodiment will be described. Only differences from the first to third examples will be described below.

Figure 18:
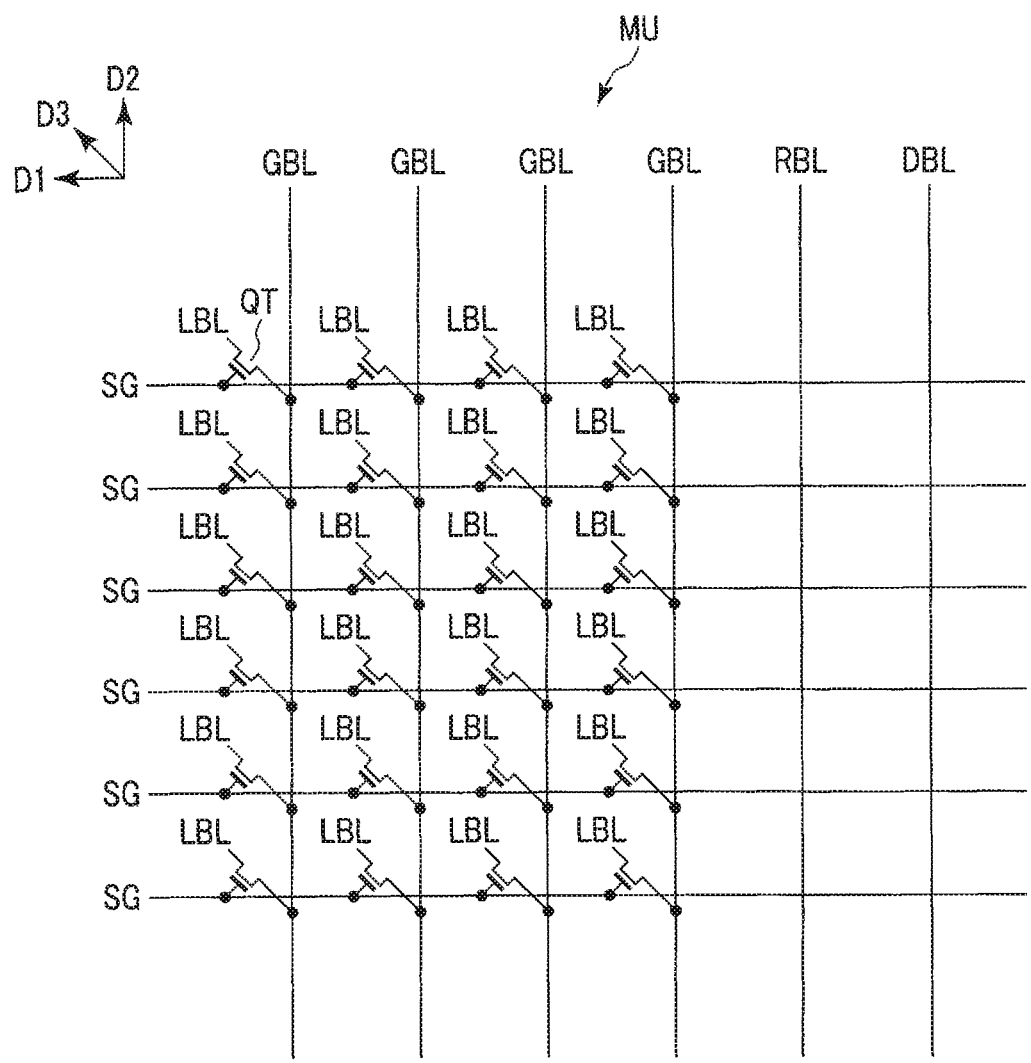
FIG. 18 is a schematic diagram depicting a layout of the global bit lines and the reference bit line in the memory cell array provided in the semiconductor memory device according to a fourth example of the third embodiment.

FIG. 18 is a schematic diagram depicting a layout of the global bit lines GBL and the reference bit line RBL in the memory unit MU provided in the semiconductor memory device according to the fourth example of the third embodiment.

As depicted in FIG. 18, in the fourth example, the dummy bit line DBL provided between the global bit line GBL and the reference bit line RBL in FIG. 17 for the third example of the third embodiment is discarded. That is, in the same layer, the reference bit line RBL is arranged so as to be sandwiched between the global bit line GBL and the dummy bit line DBL.

3.5 Fifth Example

Now, a fifth example of the third embodiment will be described. In the fifth example, a case will be described in which the selected global bit line GBL and the selected reference bit line RBL are arranged in different memory units MU. For example, in FIG. 14 for the second example of the second embodiment, the memory units MU in the active array correspond to memory units MU including the selected global bit line GBL, and the memory units MU in the non-active array correspond to memory units MU including the selected reference bit line RBL. Only differences from the first to fourth embodiments will be described.

Figure 19:
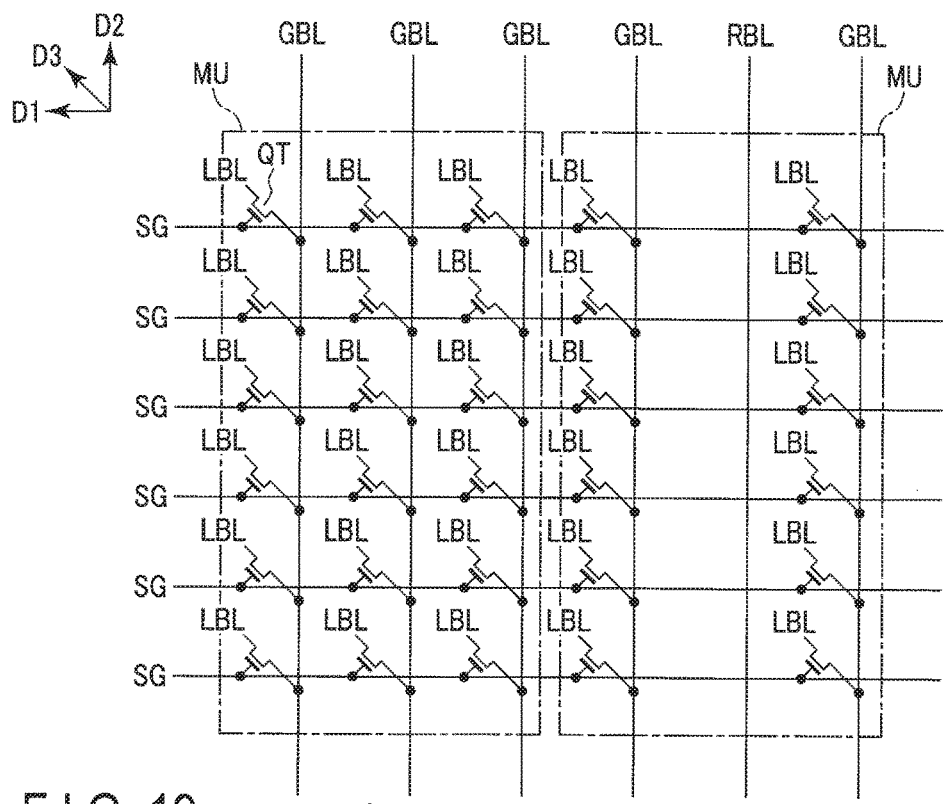
FIG. 19 is a schematic diagram depicting a layout of the global bit lines and the reference bit line in the memory cell array provided in the semiconductor memory device according to a fifth example of the third embodiment.

FIG. 19 is a schematic diagram depicting a layout of the global bit lines GBL and the reference bit line RBL in the memory unit MU provided in the semiconductor memory device according to the fifth example of the third embodiment.

As depicted in FIG. 19, the selected global bit line GBL and the selected reference bit line RBL are arranged in different memory units MU. As is the case with FIG. 16 for the second example of the third embodiment, no transistors QT are provided on the reference bit line RBL. The selected global bit line GBL and the selected reference bit line RBL three-dimensionally intersect common select gate lines SG.

3.6 Sixth Example

Now, a sixth example of the third embodiment will be described. In the sixth example, where the selected global bit line GBL and the selected reference bit line RBL are arranged in different memory units MU, a layout different from the layout in the fifth example will be described. Only differences from the first to fifth examples will be described below.

Figure 20:
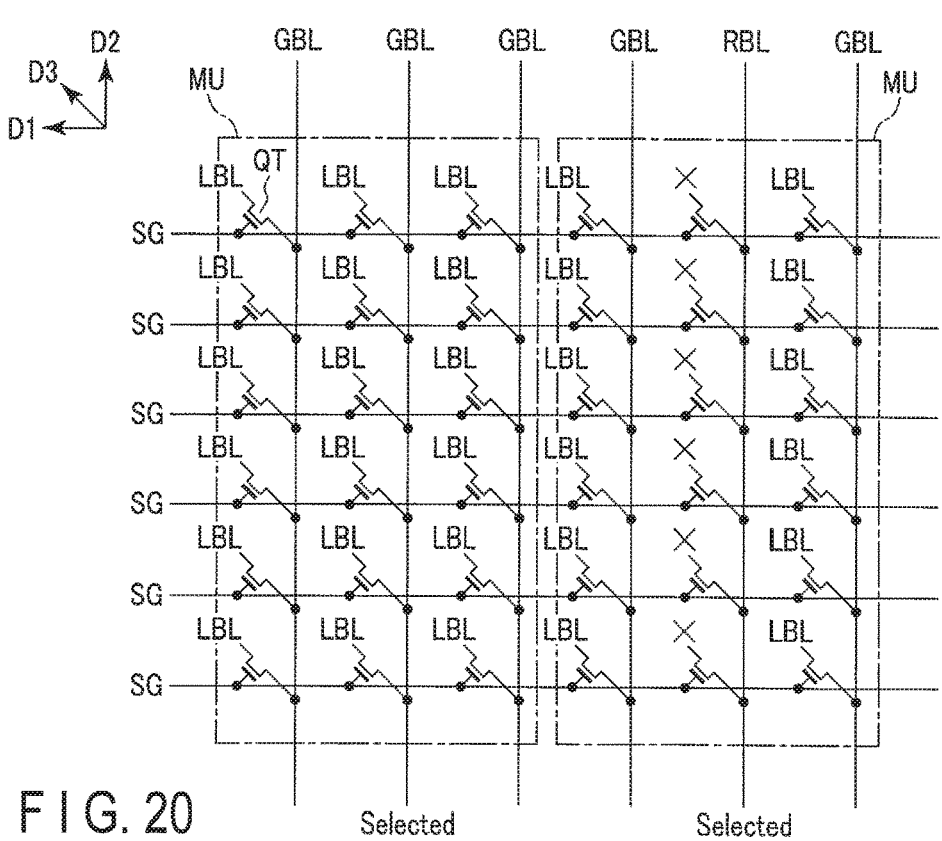
FIG. 20 is a schematic diagram depicting a layout of the global bit lines and the reference bit line in the memory cell array provided in the semiconductor memory device according to a sixth example of the third embodiment.

FIG. 20 is a schematic diagram depicting a layout of the global bit lines GBL and the reference bit line RBL in the memory unit MU provided in the semiconductor memory device according to the sixth example of the third embodiment.

As depicted in FIG. 20, in the sixth example, the transistors QT are provided on the reference bit line RBL, unlike in FIG. 19 for the fifth example of the third embodiment. Furthermore, the transistors QT connected to the reference bit line RBL are disconnected from the local bit lines LBL as is the case with FIG. 15 for the first example of the third embodiment.

3.7 Seventh Example

Now, a seventh example of the third embodiment will be described. In the seventh example, where the selected global bit line GBL and the selected reference bit line RBL are arranged in different memory units MU, a layout different from the layouts in the fifth example and the sixth example will be described. Only differences from the first to sixth examples will be described below.

Figure 21:
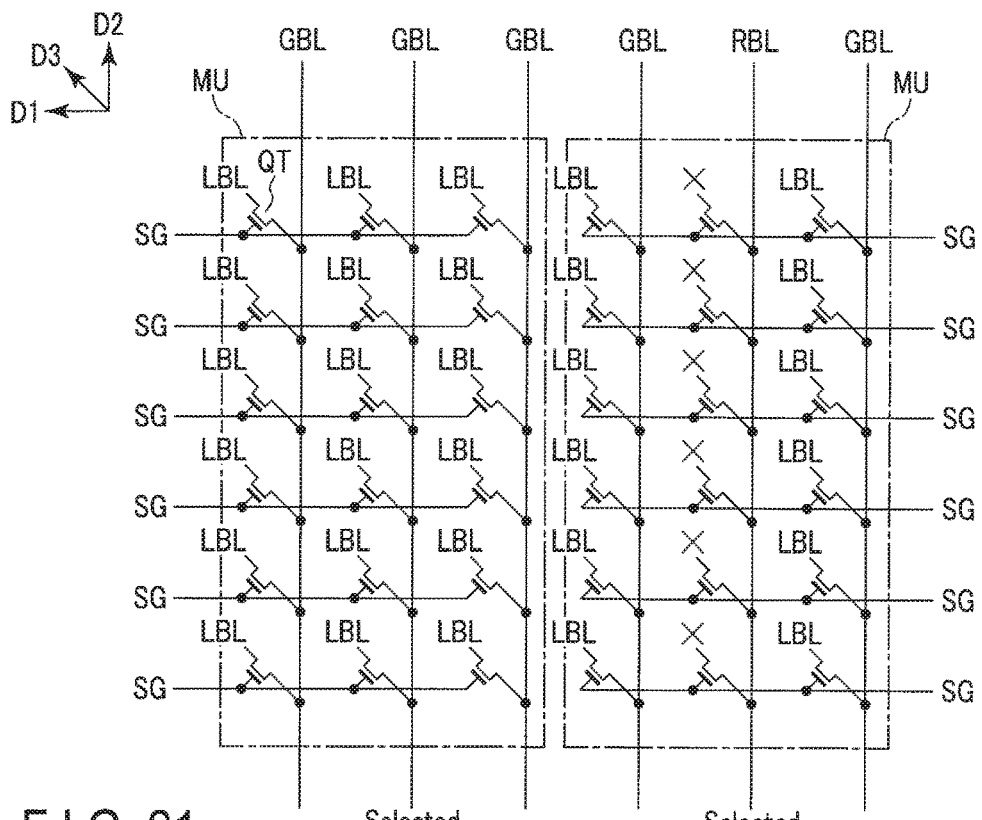
FIG. 21 is a schematic diagram depicting a layout of the global bit lines and the reference bit line in the memory cell array provided in the semiconductor memory device according to a seventh example of the third embodiment.

FIG. 21 is a schematic diagram depicting a layout of the global bit lines GBL and the reference bit line RBL in the memory unit MU provided in the semiconductor memory device according to the seventh example of the third embodiment.

As depicted in FIG. 21, in the seventh example, in the first direction D1, the select gate line SG which connected to the gate of the transistors QT connected to the selected global bit line GBL is different from the select gate line SG which connected to the gate of the transistors QT connected to the selected reference bit line RBL, unlike in FIG. 20 for the sixth example of the third embodiment. In this case, the interconnect shapes (width and height) of the select gate lines SG are substantially the same.

3.8 Eighth Example

Now, an eighth example of the third embodiment will be described. In the eighth example, where the selected global bit line GBL and the selected reference bit line RBL are arranged in different memory units MU, a layout different from the layout in the fifth to seventh examples will be described. Only differences from the first to seventh examples will be described below.

Figure 22:
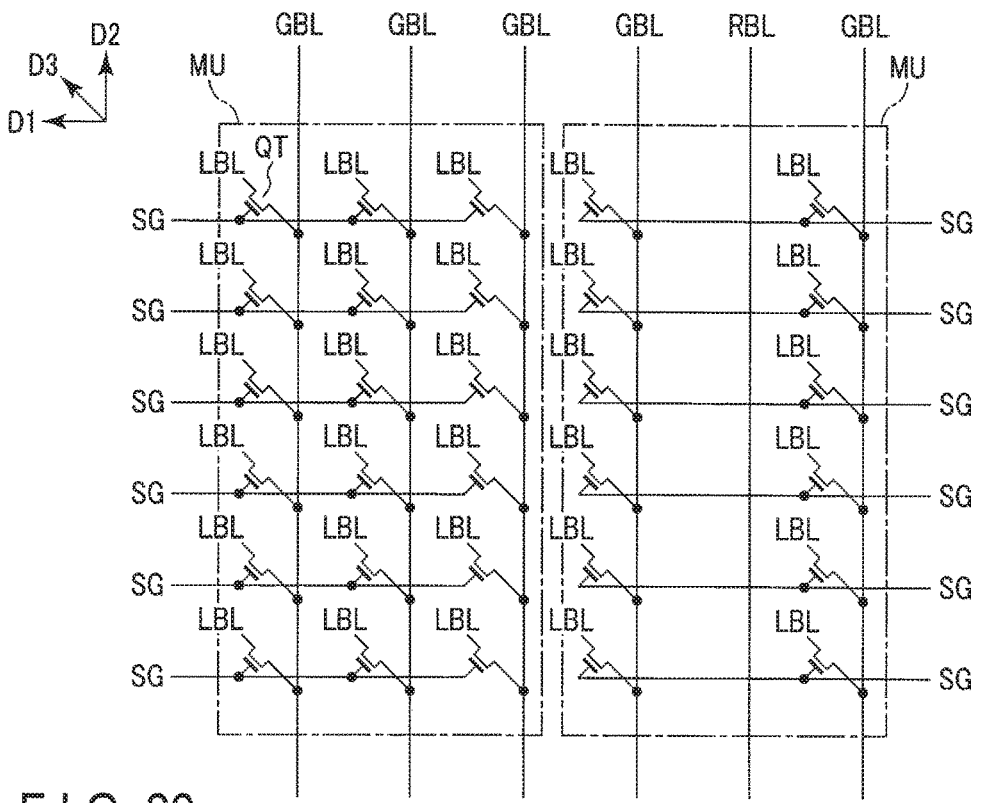
FIG. 22 is a schematic diagram depicting a layout of the global bit lines and the reference bit line in the memory cell array provided in the semiconductor memory device according to an eighth example of the third embodiment.

FIG. 22 is a schematic diagram depicting a layout of the global bit lines GBL and the reference bit line RBL in the memory unit MU provided in the semiconductor memory device according to the eighth example of the third embodiment.

As depicted in FIG. 22, in the eighth example, the transistors QT on the reference bit line RBL are discarded unlike in FIG. 21 for the seventh example of the third embodiment.

3.9 Ninth Example

Now, a ninth example of the third embodiment will be described. In the ninth example, where the selected global bit line GBL and the selected reference bit line RBL are arranged in different memory units MU, a layout different from the layout in the fifth to eight examples will be described. Only differences from the first to eighth examples will be described below.

Figure 23:
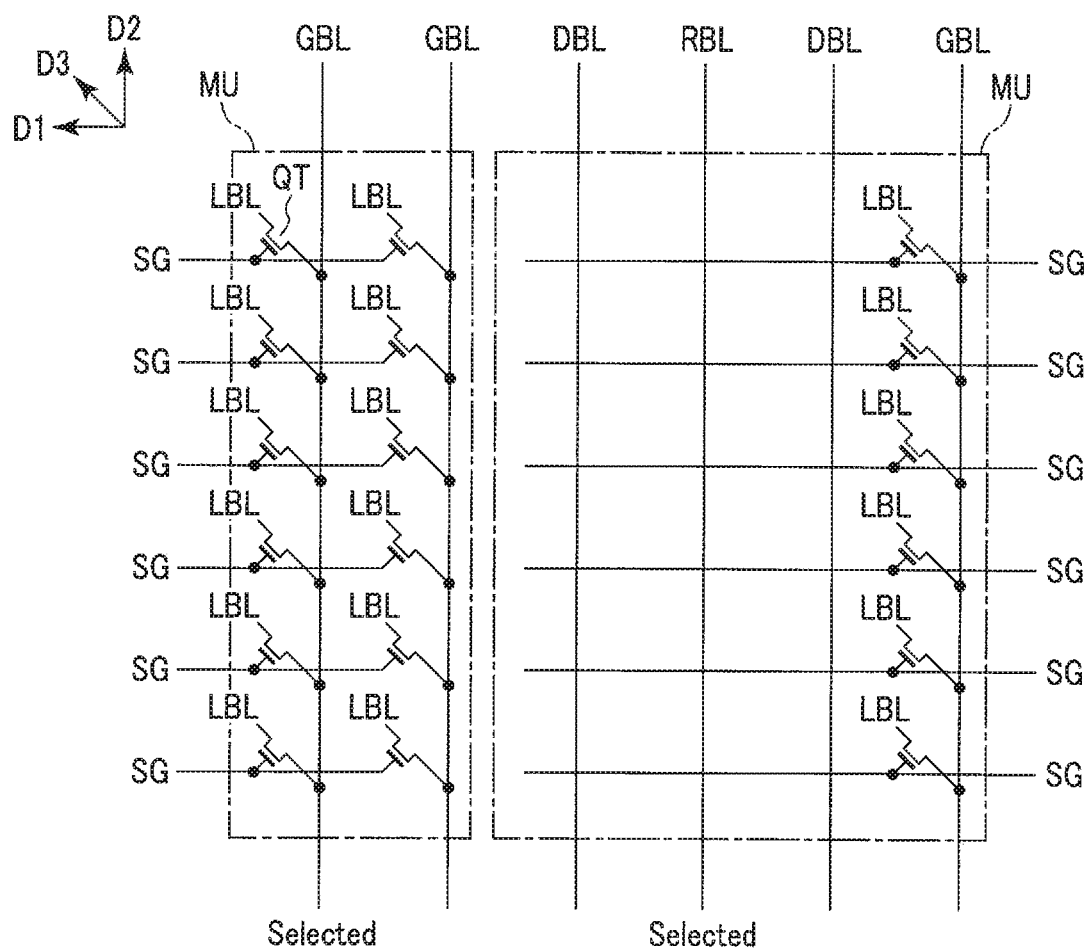
FIG. 23 is a schematic diagram depicting a layout of the global bit lines and the reference bit line in the memory cell array provided in the semiconductor memory device according to a ninth example of the third embodiment.

FIG. 23 is a schematic diagram depicting a layout of the global bit lines GBL and the reference bit line RBL in the memory unit MU provided in the semiconductor memory device according to the ninth example of the third embodiment.

As depicted in FIG. 23, the ninth example is a combination of FIG. 17 for the third example of the third embodiment and FIG. 21 for the seventh example of the third embodiment. The dummy bit lines DBL are arranged on both sides of the reference bit line RBL along the first direction D1.

3.10 Tenth Example

Now, a tenth of the third embodiment will be described. Only differences from the first to ninth examples will be described below.

Figure 24:
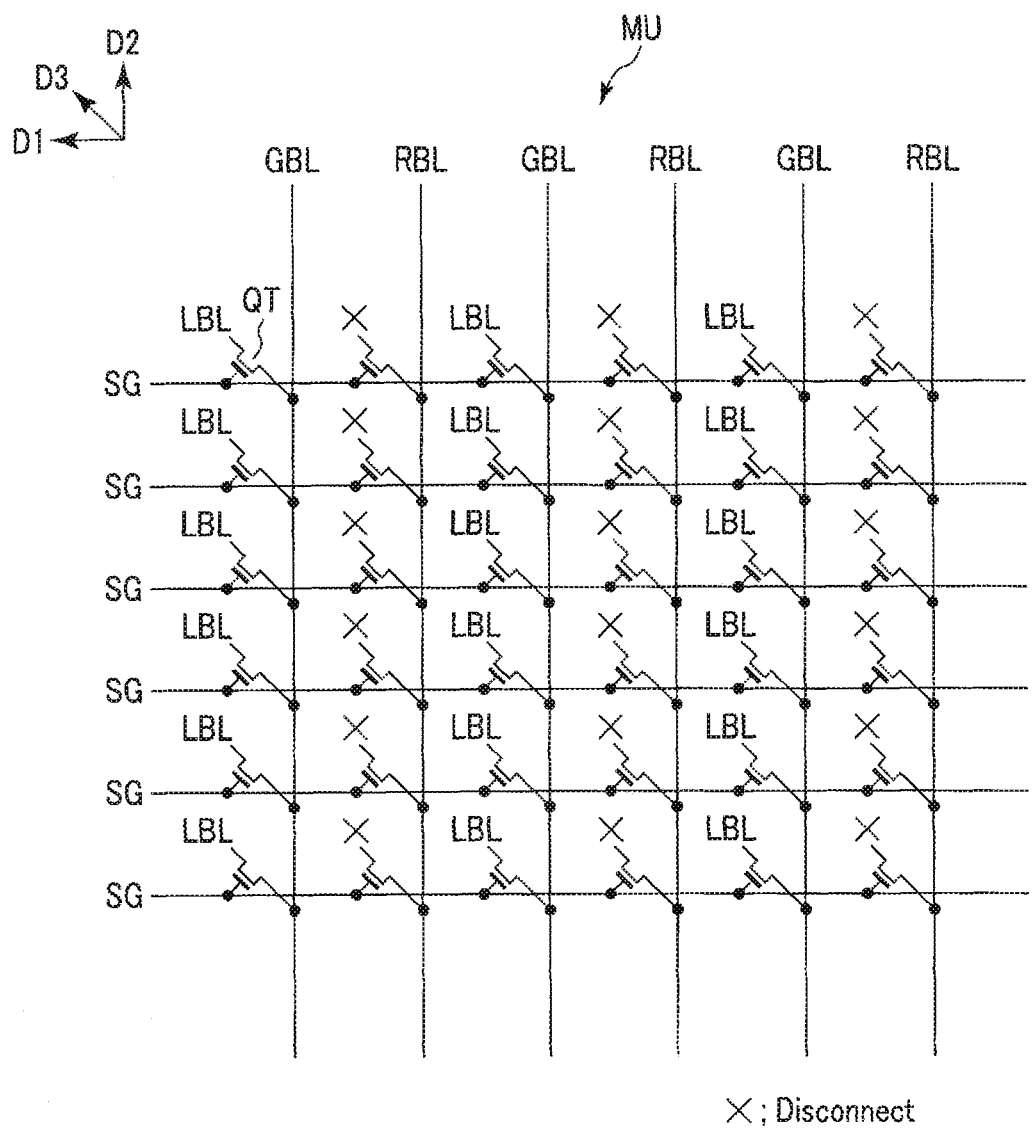
FIG. 24 is a schematic diagram depicting a layout of the global bit lines and the reference bit lines in the memory cell array provided in the semiconductor memory device according to a tenth example of the third embodiment.

FIG. 24 is a schematic diagram depicting a layout of the global bit lines GBL and the reference bit line RBL in the memory unit MU provided in the semiconductor memory device according to the tenth example of the third embodiment.

As depicted in FIG. 24, in the tenth example, a plurality of the global bit lines GBL and a plurality of the reference bit lines RBL are alternately arranged along the first direction D1 unlike in FIG. 15 for the first example of the third embodiment.

In the example in FIG. 24, the transistors QT are arranged on the reference bit line RBL but may be omitted as in the case of the second example of the third embodiment.

3.11 Eleventh Example

Now, an eleventh example of the third embodiment will be described. Only differences from the first to tenth examples will be described below.

FIG. 25 is a schematic diagram depicting a layout of the global bit lines GBL and the reference bit line RBL in the memory unit MU provided in the semiconductor memory device according to the eleventh example of the third embodiment.

As depicted in FIG. 25, in the eleventh example, the dummy bit line DBL, the reference bit line RBL, and the global bit line GBL are repeatedly arranged along the first direction D1 unlike in FIG. 18 for the fourth example of the third embodiment.

3.12 Twelfth Example

Now, a twelfth example of the third embodiment will be described. Only differences from the first to eleventh examples will be described below.

FIG. 26 is a schematic diagram depicting a layout of the global bit lines GBL and the reference bit line RBL in the memory unit MU provided in the semiconductor memory device according to the twelfth example of the third embodiment.

As depicted in FIG. 26, in the twelfth example, the dummy bit line DBL, the reference bit line RBL, the dummy bit line DBL, and the global bit line GBL are repeatedly arranged along the first direction D1 unlike in FIG. 25 for the eleventh example of the third embodiment.

3.13 Effects of the Present Embodiment

The arrangement of the global bit lines GBL and the reference bit lines RBL in the present embodiment is applicable to the first and second embodiments. This allows production of effects similar to the effects of the first and second embodiments.

Moreover, as illustrated in the first, sixth, seventh, and tenth examples of the present embodiment, the transistors QT may be provided on the reference bit line RBL. When the select gate lines SG are connected to the gates of the respective transistors QT corresponding to the reference bit line RBL, the internal capacitance of each of the transistors QT is approximately the same as the internal resistance of each of the transistors QT corresponding to the global bit line GBL. Thus, the amount of noise from the global bit line GBL is closer to the amount of noise from the reference bit line RBL, allowing the sense circuit 20 to more effectively reduce noise. Therefore, possible erroneous sensing in the sense circuit 20 is reduced, allowing the reliability of the semiconductor memory device to be enhanced.

Moreover, as depicted in the third, fourth, ninth, eleventh, and twelfth examples of the present embodiment, the dummy bit lines DBL functioning as shield lines may be provided. This enables a reduction in noise superimposed on control signals through the global bit lines GBL and the reference bit lines RBL. Therefore, possible erroneous sensing in the sense circuit 20 is reduced, allowing the reliability of the semiconductor memory device to be enhanced.

Furthermore, the voltage VUB is applied to each of the dummy bit lines DBL to set the dummy bit line DBL to a fixed voltage. This enables a reduction in noise caused by a fluctuation in the potential of the dummy bit line DBL. Therefore, the reliability of the semiconductor memory device can be enhanced.

Moreover, the capacitive elements is connected in series with the input terminals of the sense circuit 20, and thus, the voltage VUB applied to the dummy bit line can be used as the ground voltage VSS of the sense circuit 20 regardless of the read voltage VRD. Each global bit line GBL is capacitively firmly coupled to the adjacent global bit line GBL, and the voltage VUB is applied to the adjacent global bit line GBL (unselected global bit line GBL). Thus, the use of the voltage VUB as the ground voltage VSS of the sense circuit 20 allows noise in the voltage VUB to be partly canceled.

The examples of the third embodiment may be combined together wherever possible.

4. Fourth Embodiment

Now, a fourth embodiment will be described. In the fourth embodiment, four examples will be described in which the connection position of the current circuit 30 differs from the connection position in the first embodiment. Only differences from the first to third embodiments will be described.

4.1 First Example

First, a first example of the fourth embodiment will be described.

Figure 27:
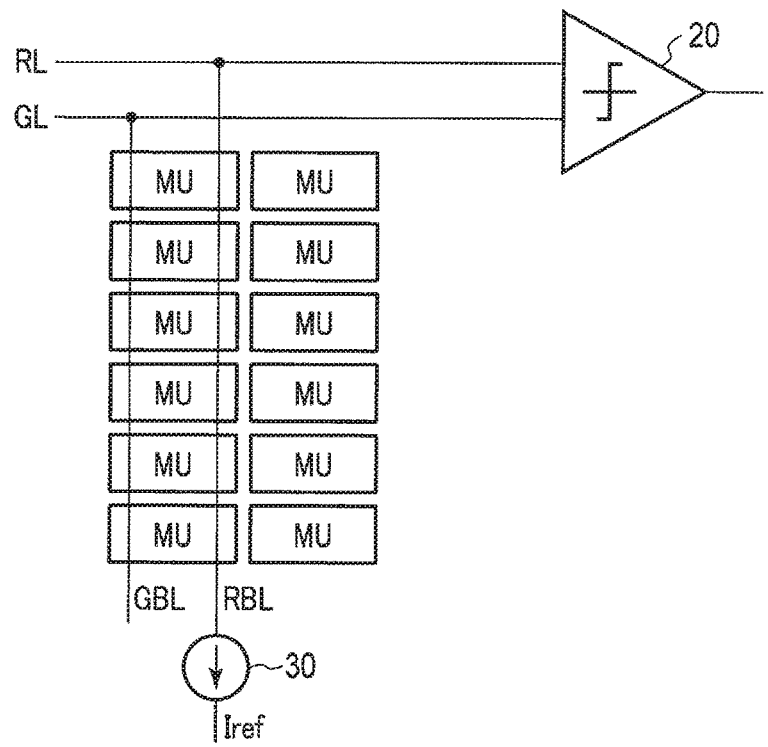
FIG. 27 is a diagram depicting a connection position between the current circuit and the reference bit line provided in the semiconductor memory device according to a first example of a fourth embodiment.

FIG. 27 is a diagram depicting the sense circuit 20 and the current circuit 30 provided in the semiconductor memory device according to the first example of the fourth embodiment. The example in FIG. 27 illustrates one global bit line GBL and one reference bit line RBL as in the case of FIG. 10 for the first embodiment. Furthermore, the differential amplifier 22 and the multiplexers 21*a* and 21*b* are omitted.

As depicted in FIG. 27, in the first example, the current circuit 30 is connected to the reference bit line RBL rather than to the position on the reference line RL close to the sense circuit 20 as depicted in FIG. 10 for the first embodiment. More specifically, a first end of the reference bit line RBL is connected to the reference line RL (multiplexer 21*b*). A second end of the reference bit line RBL is connected to the current circuit 30. In this case, for example, the current circuit 30 may be provided in association with each of the reference bit lines RBL.

4.2 Second Example

Now, a second example of the fourth embodiment will be described. Only differences from the first example will be described below.

Figure 28:
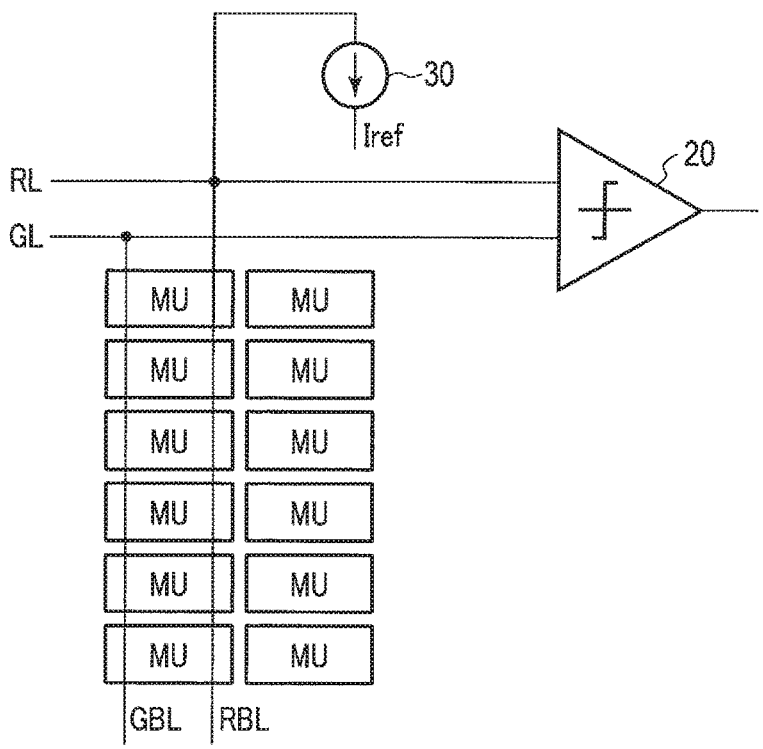
FIG. 28 is a diagram depicting a connection position between the current circuit and the reference bit line provided in the semiconductor memory device according to a second example of the fourth embodiment.

FIG. 28 is a diagram depicting the sense circuit 20 and the current circuit 30 provided in the semiconductor memory device according to a second example of the fourth embodiment.

As depicted in FIG. 28, in the second example, the current circuit 30 is connected to a position where the reference line RL and the reference bit line RBL are connected together. More specifically, the current circuit 30 is connected to a connection position between the multiplexer 21*b* and the reference line RL or a connection position between the multiplexer 21*b* and the reference bit line RBL. For example, when the current circuit 30 is connected to the connection position between the multiplexer 21*b* and the reference bit line RBL, the current circuit 30 is provided in association with each reference bit line RBL. On the other hand, when the current circuit 30 is connected to the connection position between the multiplexer 21*b* and the reference line RL, the current circuit 30 is provided in association with the reference line RL.

4.3 Third Example

Now, a third example of the fourth embodiment will be described. Only differences from the first example and the second example will be described below.

Figure 29:
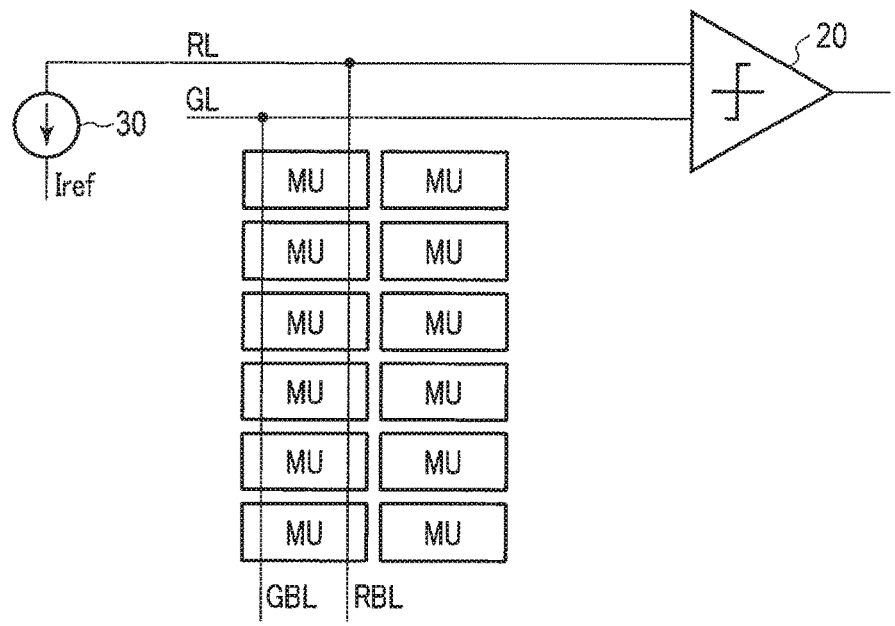
FIG. 29 is a diagram depicting a connection position between the current circuit and the reference bit line provided in the semiconductor memory device according to a third example of the fourth embodiment.

FIG. 29 is a diagram depicting the sense circuit 20 and the current circuit 30 provided in the semiconductor memory device according to the third example of the fourth embodiment.

As depicted in FIG. 29, in the third example, the current circuit 30 is connected to an end of the reference line RL positioned away from the sense circuit 20. More specifically, the first end of the reference line RL is connected to the sense circuit 20, and the second end of the reference line RL is connected to the current circuit 30.

4.4 Fourth Example

A fourth example of the fourth embodiment will be described. Only differences from the first to third examples will be described below.

Figure 30:
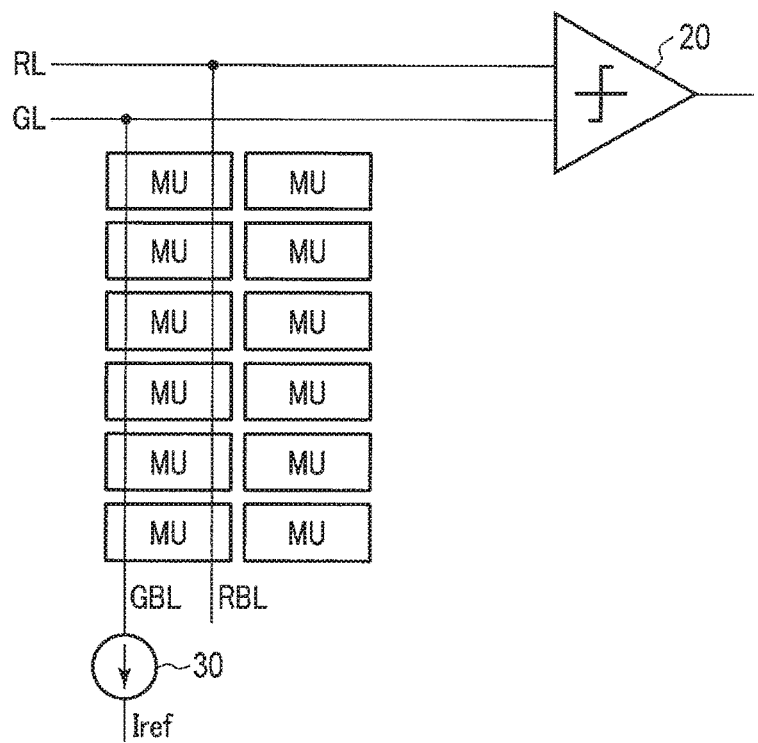
FIG. 30 is a diagram depicting a connection position between the current circuit and the reference bit line provided in the semiconductor memory device according to a fourth example of the fourth embodiment.

FIG. 30 is a diagram depicting the sense circuit 20 and the current circuit 30 provided in the semiconductor memory device according to the fourth example of the fourth embodiment.

As depicted in FIG. 30, in the fourth example, the current circuit 30 is connected to the global bit line GBL. More specifically, a first end of the global bit line GBL is connected to the global line GL (multiplexer 21a). A second end of the global bit line GBL is connected to the current circuit 30.

In this case, the reference current Iref is set to a current value that is intermediate between a current value of a current flowing while the memory cell MC is in a high resistance state and a current value of a current flowing while the memory cell MC is in a low resistance state. Then, when the selected memory cell MC is in the high resistance state, the voltages of the global bit line GBL and the global line GL are relatively high. When the selected memory cell MC is in the low resistance state, the voltages of the global bit line GBL and the global line GL are relatively low. On the other hand, the voltages of the reference bit line RBL and the reference line RL are fixed. The sense circuit 20 can read data from the memory cell MC by comparing the voltage of the global line GL with the voltage of the reference line RL.

4.5 Effects of the Present Embodiment

The connection position of the current circuit 30 in the present embodiment can be applied to the first to third embodiments. This allows production of effects similar to the effects of the first to third embodiments.

5. Fifth Embodiment

Now, a fifth embodiment will be described. In the fifth embodiment, four examples of a layout of a selected bit line group SELB will be described. Only differences from the first to fourth embodiments will be described.

5.1 First Example

First, a first example of the fifth embodiment will be described.

FIG. 31 is a schematic diagram depicting a layout of the selected bit line group SELB provided in the semiconductor memory device according to the first example of the fifth embodiment. The example in FIG. 31 illustrates a case where the reference bit line RBL is arranged in the dummy unit DU. However, the present invention is not limited to this. For example, as is the case with the first embodiment, both the reference bit line RBL and the global bit line GBL may be arranged in one memory unit MU.

As depicted in FIG. 31, a plurality of the global lines GL and a plurality of reference lines RL extend in the first direction D1 and alternately arranged along the second direction D2. More specifically, the global line GL and the reference line RL connected to one sense circuit 20 form one group. The group is repeatedly arranged along the second direction D2. For example, the global line GL0 and the reference line RL0 connected to one sense circuit 20_0, the global line GL1 and the reference line RL1 connected to one sense circuit 20_1 are arranged along the second direction D2 in order.

The global line GL and the reference line RL are provided in the same layer and have substantially the same interconnect shape. When the global line GL and the reference line RL corresponding to one sense circuit 20 are arranged adjacent to each other, common-mode noise is likely to be superimposed on the global line GL and on the reference line RL due to capacitive coupling. The sense circuit 20 can treat noise on the global line GL and the reference line RL as common-mode noise.

5.2 Second Example

Now, a second example of the fifth embodiment will be described. Only differences from the first example will be described below.

FIG. 32 is a schematic diagram depicting a layout of the selected bit line group SELB provided in the semiconductor memory device according to the second example of the fifth embodiment.

As depicted in FIG. 32, in the second example, shield lines SLD are arranged on both sides of the selected bit line group SELB in the second direction D2 so as to extend in the first direction D1, like the selected bit line group SELB. The shield lines SLD function, for example, to shield noise transmitted to the selected bit line group SELB from another interconnect provided in the same layer. For example, as is the case with the dummy bit lines DBL, the voltage VUB (for example, the ground voltage VSS, the power supply voltage VDD, or another fixed voltage) is applied to the shield lines SLD.

More specifically, for example, the shield line SLD, the global line GL0, the reference line RL0, global line GL1, the reference line RL1, and the shield line SLD are arranged in this order along the second direction D2. In this case, the shield line SLD is provided in the same layer in which the global line GL and the reference line RL are provided.

5.3 Third Example

Now, a third example of the fifth embodiment will be described. Only differences from the first and second examples will be described.

FIG. 33 is a schematic diagram depicting a layout of the selected bit line group SELB provided in the semiconductor memory device according to the third example of the fifth embodiment.

As depicted in FIG. 33, in the third example, the shield lines SLD are provided on the both sides of the selected bit line group SELB in the second direction D2 and between the global line GL and the reference line RL.

5.4 Fourth Example

Now, a fourth example of the fifth embodiment will be described. Only differences from the first to third examples will be described.

Figure 34:
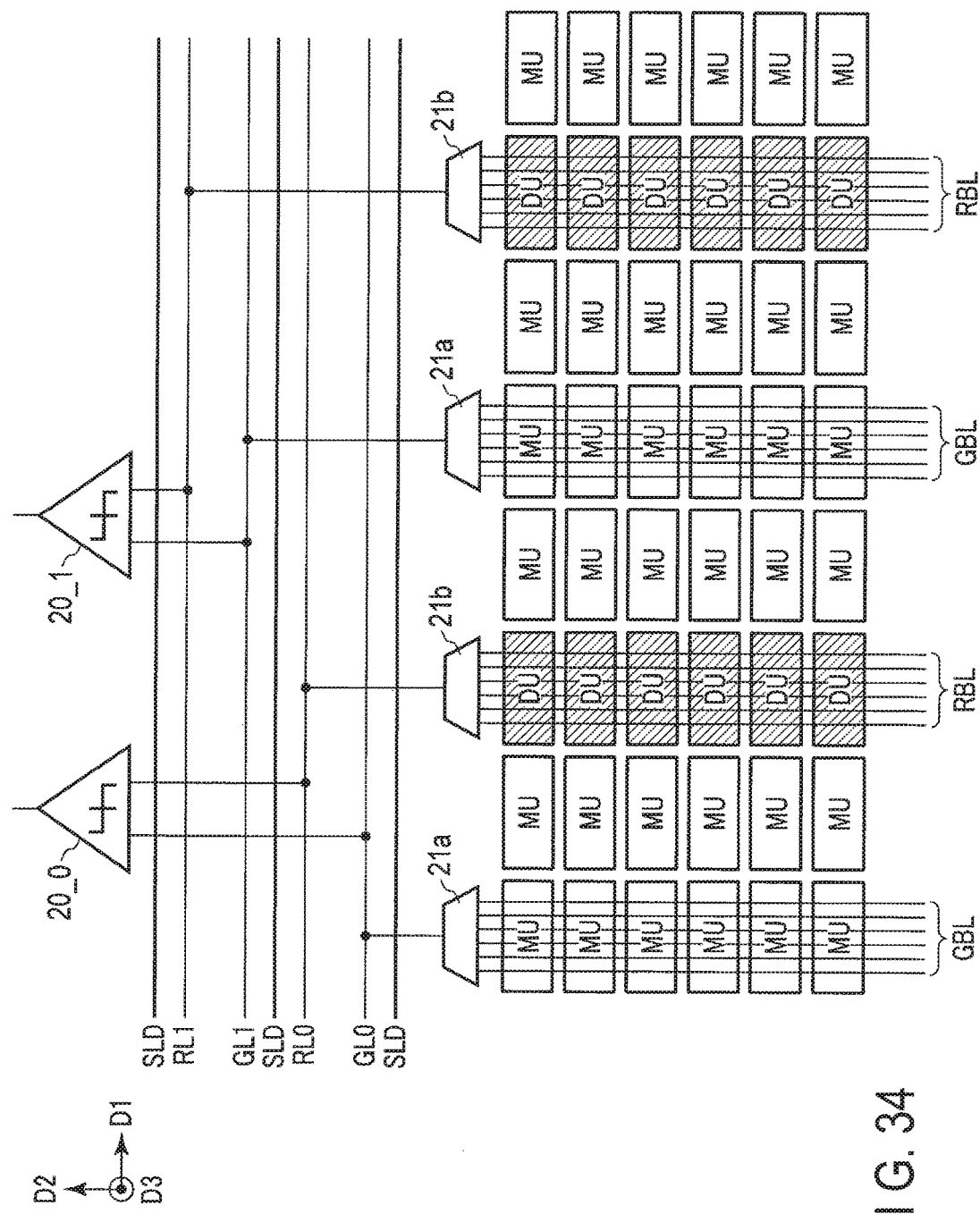
FIG. 34 is a schematic diagram depicting a layout of the selected bit line group provided in the semiconductor memory device according to a fourth example of the fifth embodiment.

FIG. 34 is a schematic diagram depicting a layout of the selected bit line group SELB provided in the semiconductor memory device according to the fourth example of the fifth embodiment.

As depicted in FIG. 34, in the fourth example, global line GL and reference line RL are connected to one sense circuit 20 (20_0 or 20_1) as a group. The shields SLD are arranged on both sides of each group in the second direction D2.

More specifically, the lines are arranged in the following order along the second direction D2: the shield line SLD, the global line GL0 and reference line RL0 connected to the sense circuit 20_0, the shield line SLD, the global line GL1 and reference line RL1 connected to the sense circuit 20_1, and the shield line SLD.

5.5 Effects of the Present Embodiment

The arrangement of the selected bit line group SELB in the present embodiment can be applied to the first to fourth embodiments. This allows production of effects similar to the effects of the first to fourth embodiments.

Moreover, the shield lines SLD can be provided as depicted in the second to fourth examples of the present embodiment. This enables a reduction in noise transmitted to the selected bit line group SELB due to capacitive coupling to another interconnect. Therefore, possible erroneous sensing in the sense circuit 20 is reduced, allowing the reliability of the semiconductor memory device to be enhanced.

6. Sixth Embodiment

Now, a sixth embodiment will be described. In the sixth embodiment, two examples of configuration of the current circuit 30 different from the configuration in the first embodiment will be described. Only differences from the first to fifth embodiments will be described.

6.1 First Example

First, a first example of the sixth embodiment will be described. In the first example, the current mirror circuit depicted in FIG. 11 for the first embodiment is discarded, and current is controlled using resistance elements.

Figure 35:
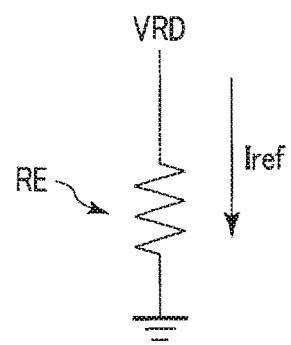
FIG. 35 is a circuit diagram of the current circuit provided in the semiconductor memory device according to a first example of a sixth embodiment.

FIG. 35 is a circuit diagram of the current circuit 30 provided in the semiconductor memory device according to the first example of the sixth embodiment.

As depicted in FIG. 35, in the first example, the current circuit 30 includes a resistance element RE. For example, the resistance element RE may be a resistance element containing polysilicon (poly-Si). A first end of the resistance element RE is connected, for example, to the reference line RL, and during a read operation, the read voltage VRD is applied to the first end of the resistance element RE. A second end of the resistance element RE is grounded. The current value of the reference current Iref is determined according to the read voltage VRD and a resistance value of the resistance element RE. The resistance element RE may be a variable resistance element, with the resistance value thereof switched as needed.

6.2 Second Example

Now, a second example of the sixth embodiment will be described. In the second example, a case will be described where a plurality of current mirror circuits depicted in FIG. 11 for the first embodiment is provided in parallel so as to enable the current value of the reference current Iref to be adjusted.

Figure 36:
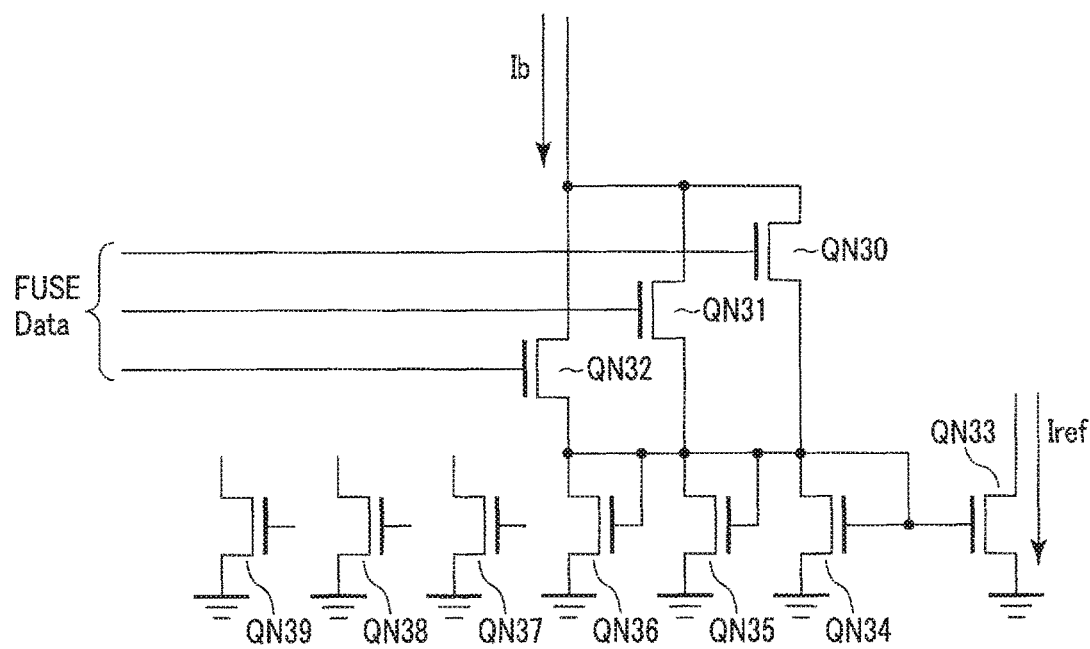
FIG. 36 is a circuit diagram of the current circuit provided in the semiconductor memory device according to a second example of the sixth embodiment.

FIG. 36 is a circuit diagram of the current circuit 30 provided in the semiconductor memory device according to the second example of the sixth embodiment. In the example in FIG. 36, a case where three current mirror circuits are arranged in parallel will be described by way of example. However, the number of current mirror circuit can be optionally set.

As depicted in FIG. 36, the current circuit 30 includes N-channel transistors QN30 to QN39. The transistors QN30 to QN32 have respective drains connected together such that, for example, the drain current Ib from the BGR circuit (not depicted in the drawings) is supplied to the set of the drains. FUSE data is input to gates of the transistors QN30 to QN32. The FUSE data is data preset based on manufacturing variation in each type of semiconductor memory device during shipping inspection. Sources of the transistors QN30 to QN32 are all connected to drains and gates of the QN34 to QN36 and to a gate of the transistor QN33. Sources of the transistors QN34 to QN36 are grounded. A drain of the transistor QN33 is connected, for example, to the reference line RL, and a source of the transistor QN33 is grounded. That is, the transistors QN34 to QN36 form a current mirror with the transistor QN33. Transistors QN37 to QN39 are reserved transistors arranged proximate to the current mirror circuit.

For example, the transistors QN30 to QN32 are determined to be turned on/off according to the FUSE data. Consequently, a current ratio between the drain current Ib and the reference current Iref is determined. For example, the transistors QN33 to QN36 are assumed to have substantially the same transistor size and the same transistor characteristics. If any one of the transistors QN30 to QN32 is in an on state, the drain current Ib and the reference current Iref are approximately equal to each other. Furthermore, for example, if the transistors QN30 to QN32 are in the on state, the reference current Iref and the drain current Ib are such that Iref=3Ib. Additionally, for example, the transistors QN34 to QN36 may be different from one another in size, and the current ratio between the current Ib and the reference current Iref may be determined according to the transistor size.

The case has been described where the current value of the reference current Iref is controlled based on the FUSE data. However, the control may be performed based on another signal. For example, a digital signal with temperature information from a BGR circuit having temperature characteristics may be input to gates of the transistors QN30 to QN32. In this case, the reference current Iref is controlled according to fluctuation in operating temperature.

6.3 Effects of the Present Embodiment

The current circuit 30 in the present embodiment can be applied to the first to fifth embodiments. This allows production of effects similar to the effects of the first to fifth embodiments.

7 Modifications

The semiconductor memory device according to the above-described embodiments includes a first insulating layer (101@FIG. 6) provided above a semiconductor substrate (100@FIG. 6), a global bit line (102@FIG. 6) provided on the first insulating layer and extending in a first direction parallel to the semiconductor substrate, a reference bit line (116@FIG. 7) provided on the first insulating layer and extending in the first direction, a second insulating layer (104@FIG. 7) provided on the global bit line and the reference bit line, a select gate line (105@FIG. 7) provided on the second insulating layer and extending in a second direction parallel to the semiconductor substrate and different from the first direction, a first transistor (QT@FIG. 6) provided on the global bit line, a first end of the first transistor being coupled to the global bit line, a gate of the first transistor being coupled to the select gate line, a local bit line (114@FIG. 6) coupled to a second end of the first transistor and extending in a third direction perpendicular to the semiconductor substrate, first and second memory cells (MC@FIG. 6) stacked above the semiconductor substrate and coupled to the local bit line, and a sense amplifier (20@FIG. 2) including a first input terminal coupled to the global bit line and a second input terminal coupled to the reference bit line, the sense amplifier being capable of reading data from the first and second memory cells. The global bit line and the reference bit line three-dimensionally intersect the select gate line via the second insulating layer.

Application of the above-described embodiments allows provision of a semiconductor memory device that allows reliability to be enhanced. The embodiments are not limited to the above-described forms and may be variously modified.

Moreover, the first to sixth embodiments may be combined together wherever possible.

Moreover, in the above-described embodiments, the ReRAM (resistive random access memory) has been described as a semiconductor memory device by citing examples. However, the present invention is not limited to this. For example, the present invention is applicable to semiconductor memory devices in general having elements that store data utilizing variation in resistance, such as MRAM using magnetic tunnel junction (MTJ) elements and PCRAM (phase-change random access memory). The present invention is also applicable to semiconductor memory devices, whether volatile memory or nonvolatile memory, having elements which can store data based on a variation in resistance resulting from application of current or voltage or read stored data by converting a difference in resistance resulting from the variation in resistance into a difference in current or voltage.

Moreover, the expression "approximately or substantially the same", as used in the above-described embodiments, does not necessarily refer to a close match but allows for a certain degree of error so long as the effects of the above-described embodiments can be produced. For example, the present invention allows for, as an error, a variation in interconnect shape (height or width), distance between interconnects, capacitance-between-interconnects, transistor size, or transistor characteristics, which results from a manufacturing variation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first insulating layer provided above a semiconductor substrate;
a global bit line provided on the first insulating layer and extending in a first direction parallel to the semiconductor substrate;
a reference bit line provided on the first insulating layer and extending in the first direction;
a dummy bit line provided on the first insulating layer adjacent to the reference bit line and extending in the first direction;
a second insulating layer provided on the global bit line and the reference bit line;
a selected gate line provided on the second insulating layer and extending in a second direction parallel to the semiconductor substrate and different from the first direction;
a first transistor provided on the global bit line, a first end of the first transistor being coupled to the global bit line, a gate of the first transistor being coupled to the select gate line;
a local bit line coupled to a second end of the first transistor and extending in a third direction perpendicular to the semiconductor substrate;
first and second memory cells stacked above the semiconductor substrate and coupled to the local bit line; and
a sense amplifier including a first input terminal coupled to the global bit line and a second input terminal coupled to the reference bit line, the sense amplifier being capable of reading data from the first and second memory cells,
wherein the global bit line and the reference bit line three-dimensionally intersect the select gate line via the second insulating layer.

2. The device according to claim 1, wherein the global bit line and the reference bit line have approximately the same width.

3. The device according to claim 1, wherein a distance between the global bit line and the select gate line is approximately the same as a distance between the reference bit line and the select gate line.

4. The device according to claim 1, wherein the global bit line and the reference bit line have approximately the same height.

5. The device according to claim 1, wherein a line length from a position where the global bit line and the select gate line three-dimensionally intersect each other to the first input terminal of the sense amplifier is approximately the same as a line length from a position where the reference bit line and the select gate line three-dimensionally intersect each other to the second input terminal of the sense amplifier.

6. A semiconductor memory device comprising:
a first insulating layer provided above a semiconductor substrate;
a global bit line provided on the first insulating layer and extending in a first direction parallel to the semiconductor substrate;
a reference bit line provided on the first insulating layer and extending in the first direction;
a second insulating layer provided on the global bit line and the reference bit line;
a selected gate line provided on the second insulating layer and extending in a second direction parallel to the semiconductor substrata and different from the first direction;
a first transistor provided on the global bit line, a first end of the first transistor being coupled to the global bit line, a gate of the first transistor being coupled to the select gate line;
a second transistor provided on the reference bit line, a first end of the second transistor being coupled to the reference bit line, a second end of the second transistor being electrically uncoupled, a gate of the second transistor being coupled to the select gate line;

a local bit line coupled to a second end of the first transistor and extending in a third direction perpendicular in the semiconductor substrate;

first and second memory cells stacked above the semiconductor substrate and coupled to the local bit line; and a sense amplifier including a first input terminal coupled to the global bit line and a second input terminal coupled to the reference bit line, the sense amplifier being capable of reading data from the first and second memory cells, wherein the global bit line and the reference bit line three-dimensionally intersect the select gate line via the second insulating layer.

7. A semiconductor memory device comprising:

a first insulating layer provided above a semiconductor substrate;

a global bit line provided on the first insulating layer and extending in a first direction parallel to the semiconductor substrate;

a reference bit line provided on the first insulating layer and extending in the first direction;

a second insulating layer provided on the global bit line the reference bit line;

a selected gate line provided on the second insulating layer and extending in a second direction parallel to the semiconductor substrate and different from the first direction;

a first transistor provided on the global bit line, a first end of the first transistor being coupled to the global bit line, a gate of the first transistor being coupled to the select gate line;

a local bit line coupled to a second end of the first transistor and extending in a third direction perpendicular to the semiconductor substrate;

first and second memory cells stacked above the semiconductor substrate and coupled to the local bit line;

a word line coupled to the first memory cell;

a second transistor, a first end of the second transistor being coupled to the word line;

a global word line provided below the global bit line and the reference bit line and coupled to a gate of the second transistor, the global word line being extending in the second direction; and a sense amplifier including a first input terminal coupled to the global bit line and a second input terminal coupled to the reference bit line, the sense amplifier being capable of reading data from the first and second memory cells, wherein the global bit line and the reference bit line three-dimensionally intersect the select gate line via the second insulating layer, and a distance between the global bit line and the global word line is approximately the same as a distance between the reference bit line and the global word line.

8. The device according to claim 1, wherein the sense amplifier has a function to cancel an input referred offset.

9. The device according to claim 1, wherein the sense amplifier includes a differential amplifier of a differential input type.

10. The device according to claim 1, wherein the first transistor is a vertical thin film transistor (TFT).

11. The device according to claim 1, wherein the first and second memory cells include resistive random access memory element.

* * * * *